United States Patent
Yoo et al.

(10) Patent No.: US 11,445,702 B2
(45) Date of Patent: Sep. 20, 2022

(54) PET CARE DEVICE

(71) Applicant: LG ELECTRONICS INC., Seoul (KR)

(72) Inventors: Hyunsun Yoo, Seoul (KR); Miju Kim, Seoul (KR); Hyewon Kim, Seoul (KR); Ilha Park, Seoul (KR); Wookjun Chung, Seoul (KR); Jekwang Youn, Seoul (KR); Youngdon Kim, Seoul (KR); Jaehung Chun, Seoul (KR); Yousook Eun, Seoul (KR); Joogyeom Kim, Seoul (KR); Sungkyung Kim, Seoul (KR); Myongsun Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 305 days.

(21) Appl. No.: 16/574,362

(22) Filed: Sep. 18, 2019

(65) Prior Publication Data
US 2020/0085015 A1    Mar. 19, 2020

Related U.S. Application Data

(60) Provisional application No. 62/733,213, filed on Sep. 19, 2018.

(30) Foreign Application Priority Data

Dec. 13, 2018  (KR) .................. 10-2018-0160996
Feb. 11, 2019  (KR) .................. 10-2019-0015496
Jun. 10, 2019  (KR) .................. 10-2019-0068258

(51) Int. Cl.
H05K 1/14      (2006.01)
A01K 13/00     (2006.01)
H05K 1/18      (2006.01)

(52) U.S. Cl.
CPC ............ *A01K 13/001* (2013.01); *H05K 1/14* (2013.01); *H05K 1/181* (2013.01);
(Continued)

(58) Field of Classification Search
CPC ....................................................... A01K 13/001
(Continued)

(56) References Cited

U.S. PATENT DOCUMENTS

2007/0185553 A1   8/2007   Kennedy
2010/0104471 A1   4/2010   Harmon et al.
(Continued)

FOREIGN PATENT DOCUMENTS

CA    2 541 447    9/2007
CN    2228297      6/1996
(Continued)

OTHER PUBLICATIONS

European Search Report dated Feb. 18, 2020 issued in Application No. 19197714.9.
(Continued)

*Primary Examiner* — Stanley Tso
(74) *Attorney, Agent, or Firm* — Ked & Associates, LLP

(57) ABSTRACT

A pet care device may include a head having a sterilizer and a handle extending from the head. The head may be formed of an outer body and an inner body positioned in an inner region of the outer body. A first space may be formed between the outer body and the inner body in which the sterilizer is provided. The sterilizer may include at least one light emitting device, and a light device may cover the first space. A second space partitioned from the first space may be at least partially located inside the inner body. Hair and/or debris may be collected in the second space.

24 Claims, 23 Drawing Sheets

(52) U.S. Cl.
CPC .............. *H05K 2201/09027* (2013.01); *H05K 2201/09063* (2013.01); *H05K 2201/10106* (2013.01); *H05K 2201/10151* (2013.01); *H05K 2201/10522* (2013.01)

(58) Field of Classification Search
USPC ....................................................... 119/600
See application file for complete search history.

(56) References Cited

U.S. PATENT DOCUMENTS

| | | | |
|---|---|---|---|
| 2011/0308034 A1 | 12/2011 | Powers et al. | |
| 2011/0308035 A1* | 12/2011 | Casper | A01K 13/001 15/344 |
| 2013/0051046 A1* | 2/2013 | Yeh | F21S 43/26 362/487 |
| 2013/0197495 A1 | 8/2013 | Koifman et al. | |
| 2014/0303501 A1* | 10/2014 | Jin | A61B 8/4477 600/459 |
| 2015/0305969 A1 | 10/2015 | Giraud et al. | |
| 2017/0372634 A1 | 12/2017 | Straka et al. | |
| 2018/0161951 A1 | 6/2018 | Billings et al. | |
| 2020/0050829 A1* | 2/2020 | Akcasu | G06F 3/0412 |
| 2020/0051046 A1* | 2/2020 | Wang | G10L 13/00 |
| 2020/0188543 A1* | 6/2020 | Etter | A61B 50/22 |

FOREIGN PATENT DOCUMENTS

| | | |
|---|---|---|
| CN | 2519641 | 11/2002 |
| CN | 102755654 | 10/2012 |
| CN | 103491924 | 1/2014 |
| CN | 204033526 | 12/2014 |
| CN | 104545291 | 4/2015 |
| CN | 104918593 | 9/2015 |
| CN | 106942875 | 7/2017 |
| CN | 107048665 | 8/2017 |
| CN | 107343697 | 11/2017 |
| CN | 107646725 | 2/2018 |
| CN | 212631247 | 3/2021 |
| KR | 10-2005-0076471 | 7/2005 |
| KR | 10-2006-0007303 | 1/2006 |
| KR | 10-2006-0116425 | 11/2006 |
| KR | 20-2009-0007699 | 7/2009 |
| KR | 10-2013-0116994 | 10/2013 |
| KR | 20-2016-0002747 | 8/2016 |
| KR | 10-2017-0119434 | 10/2017 |
| KR | 10-1816704 | 1/2018 |
| WO | WO 2018/013581 | 1/2018 |

OTHER PUBLICATIONS

European Search Report dated Feb. 19, 2020 issued in Application No. 19198169.5.
U.S. Office Action dated Dec. 22, 2020 issued in U.S. Appl. No. 16/574,302.
Chinese Office Action dated May 7, 2021 issued in CN Application No. 201910884786.0.
European Search report dated Dec. 16, 2019.
Chinese Office Action issued in Application No. 201910885823.X dated May 7, 2021.
Chinese Office Action issued in Application No. 201910886990.6 dated Apr. 21, 2021.
U.S. Appl. No. 16/572,851, filed Sep. 17, 2019.
U.S. Appl. No. 16/574,362, filed Sep. 18, 2019.
Chinese Notice of Allowance dated Apr. 29, 2022 issued in CN Application No. 201910886990.6.
Tsao, Yao-Chung, Søndergaard T., Skovsen E., Gurevich L., Pedersen K., Pedersen Thomas G. Pore size dependence of diffuse light scattering from anodized aluminum solar cell backside reflectors. Opt Express. Jan. 14, 2013; 21 Suppl 1: A84-95. DOI: 10.1364/OE.21.000A84. PMID: 23389279.
United States Office Action dated May 26, 2022 issued in co-pending related U.S. Appl. No. 16/572,851.

* cited by examiner

PET CARE DEVICE

CROSS-REFERENCE TO RELATED APPLICATION(S)

This application claims priority under 35 U.S.C. § 119 to U.S. Provisional Application No. 62/733,213 filed on Sep. 19, 2018, and to Korean Application Nos. 10-2018-0160996 filed on Dec. 13, 2018, 10-2019-0015496 filed on Feb. 11, 2019, and 10-2019-0068258 filed on Jun. 10, 2019, whose entire disclosure(s) is/are hereby incorporated by reference.

BACKGROUND

1. Field

The present disclosure relates to a pet care device.

2. Background

A pet care device may include a brush to manage pet hair or fur and a light to treat pet skin.

Korean Patent Laid-Open Publication No. 10-2006-0007303 (hereinafter "related art"') discloses a pet care device or pet brush. However, such pet care device has various disadvantages, which the present disclosure solves.

The above reference is incorporated by reference herein where appropriate for appropriate teachings of additional or alternative details, features and/or technical background.

DETAILED DESCRIPTION OF THE INVENTION

Figure 1:
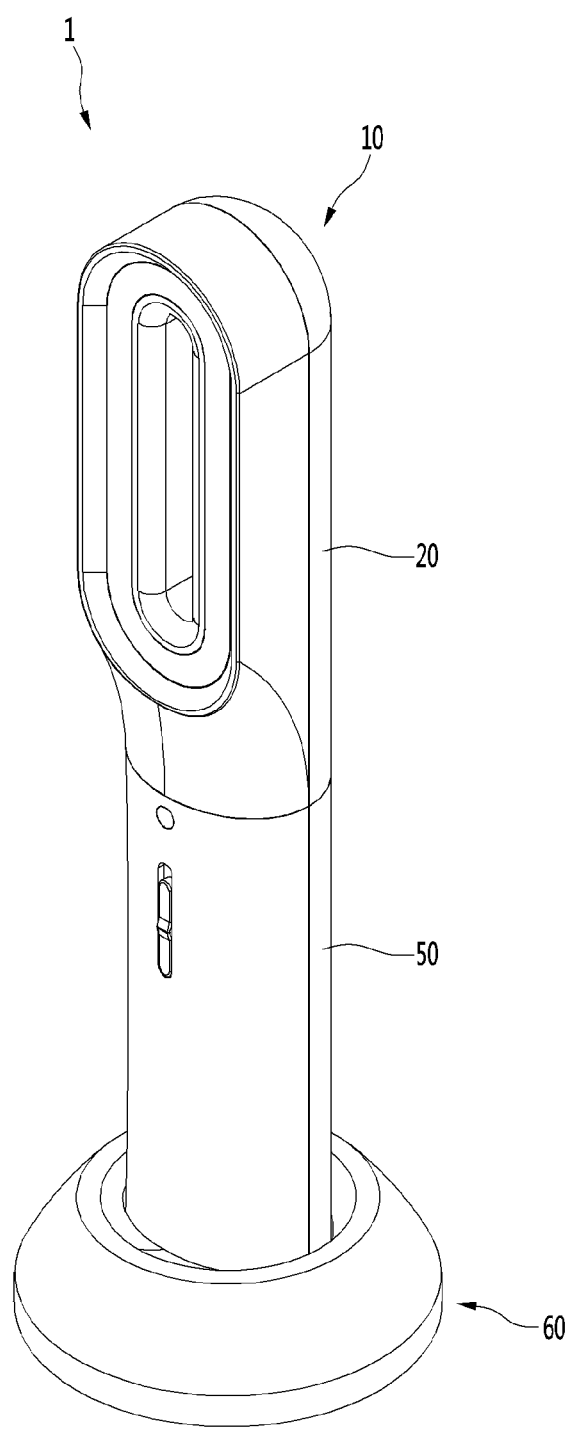
FIG. 1 is a view showing a pet care device according to an embodiment.
Figure 2:
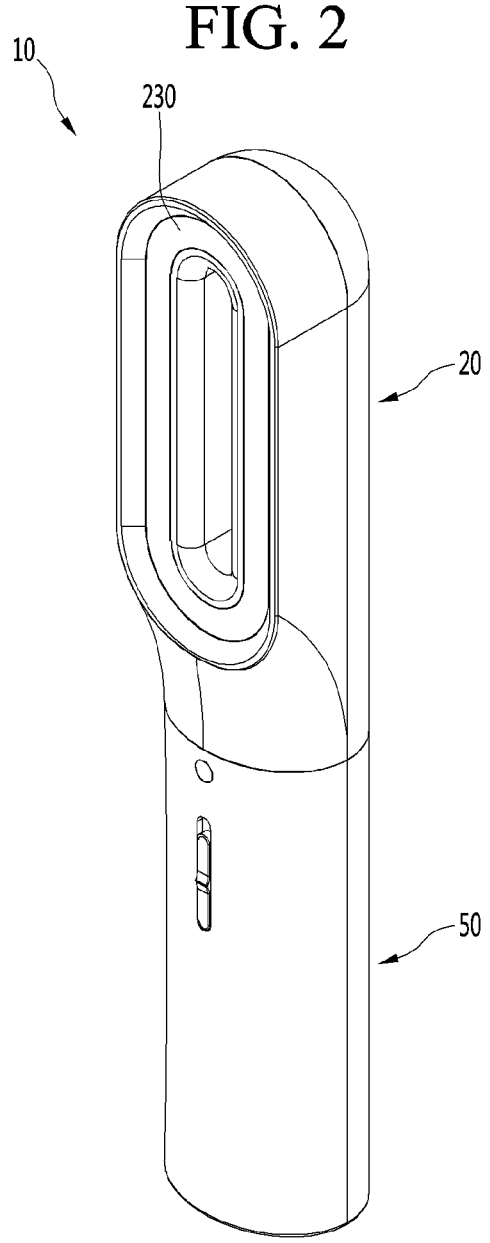
FIG. 2 is a perspective view of a main body according to an embodiment.
Figure 3:
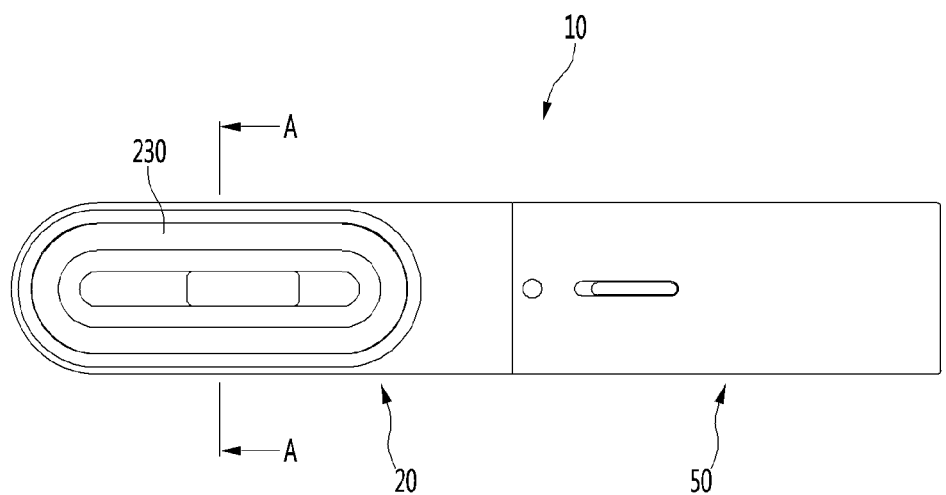
FIG. 3 is a plan view of the main body of FIG. 2.

Referring to FIGS. 1 to 6, a skincare or haircare device 1, e.g., a pet care device, according to an embodiment may include a main body 10 to manage pet skin or hair, and a base or support 60 on which the main body 10 may be mounted. The main body 10 may include a handle 50 and a head 20 extending from the handle 50. A care tool among various detachable care tools may further be optionally coupled to the head 20. Details of the care tools that may be swapped and coupled to the head 20 will be described later with reference to FIGS. 13-24.

A longitudinal direction of the pet care device 1 may be a direction in which the handle 50 and the head 20 extend. The user may hold the handle 50 to manage pet hair or fur or treat head skin via the head 20 and/or a care tool attached to the head 20. The base 60 may supply external power to the handle 50.

The head 20 may include a sterilizer 220 (FIG. 7) to be described later with reference to FIG. 7. The handle 50 may supply power to the sterilizer 220. The sterilizer 220 may include at least one light emitting device 223 (e.g., an ultraviolet light-emitting diode), which may emit light through a light diffuser or transmitter 230 provided in the head 20. The light diffuser 230 may be a light guide plate and may serve as a light guide.

UV light irradiated through the light diffuser 230 may treat pet skin by removing bacteria or viruses, which may cure diseases or maintain skin health of the pet. The light diffuser 230 may be provided in a predetermined area of the head 20. Light may be transmitted only via the predetermined area, preventing unnecessary irradiation outside of an area to be treated. The user may treat pet skin or hair by bringing the predetermined area and/or the light diffuser 230 close to the pet skin or hair. The light diffuser 230 will be described in more detail with reference to FIG. 7.

Figure 4:
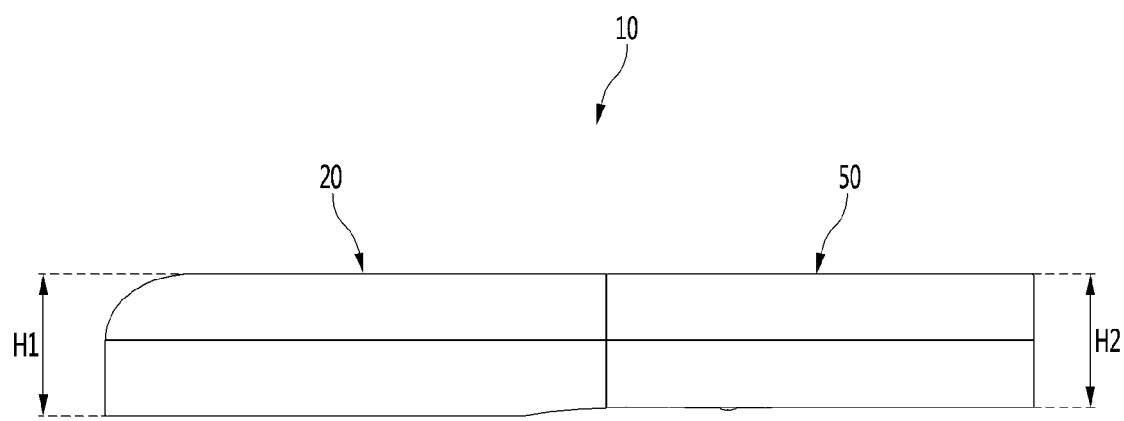
FIG. 4 is a side view of the main body of FIG. 2.

Referring to FIG. 4, a height H1 of the head 20 may be formed to be higher than a height H2 of the handle 50, and a front face of the head 20 having the light diffuser 230 may protrude beyond the handle. When the user grips the handle 50 to apply the head 20 to the pet skin or hair, the handle 50 may not contact the pet skin or hair. Shapes of the head 20 and the main body 10 may be configured to allow a maximum contact of the front face of the head 20 with the pet.

Figure 5:
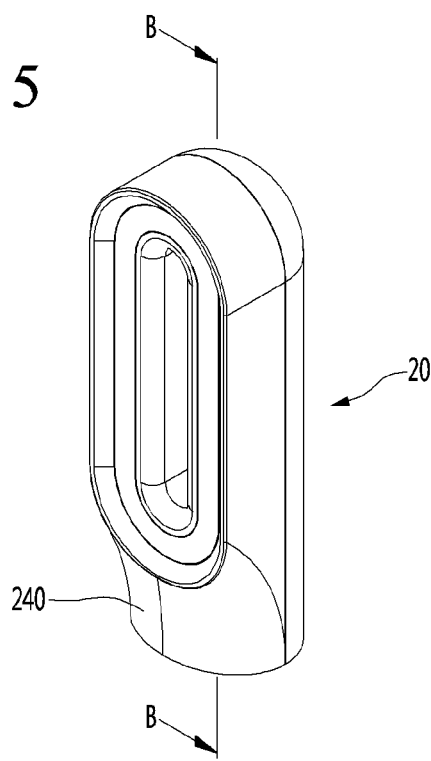
FIGS. 5 and 6 are perspective views showing a state in which a head and a handle of the main body are separated from each other.

The head 20 may be detachable from the handle 50, or alternatively may be integrally formed with the handle 50. Referring to FIG. 5, an example where the head 20 is removable from the handle 50 is shown. When the head 20 is separated from the handle 50, the head 20 may be easily cleaned, repaired, or swapped for another head 20. Since the head 20 may not include a battery (which may instead be provided in the handle 50), the head 20 may be cleaned simply with water when the head 20 is separated from the handle 50. The head 20 may be waterproofed to protect the light emitting device 223 behind the light diffuser 230.

The head 20 and the handle 50 may be detachably coupled via first and second couplers 240 and 530 provided in the head 20 and the handle 50, respectively. As an example, the second coupler 530 may be configured to be inserted and pressed-fit into the first coupler 240 via grooves and recesses. As another example, the first coupler 240 may be configured to be inserted and pressed-fit into the second coupler 530.

For convenience of description, an example where the second coupler 530 of the handle 50 is inserted into the first coupler 240 of the head 20 will be described. The second coupler 530 may be inserted along the longitudinal direction of the pet care device 1 into the first coupler 240.

Figure 6:
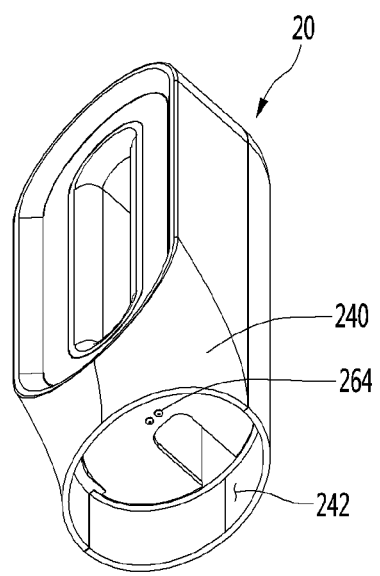
Figure 6:
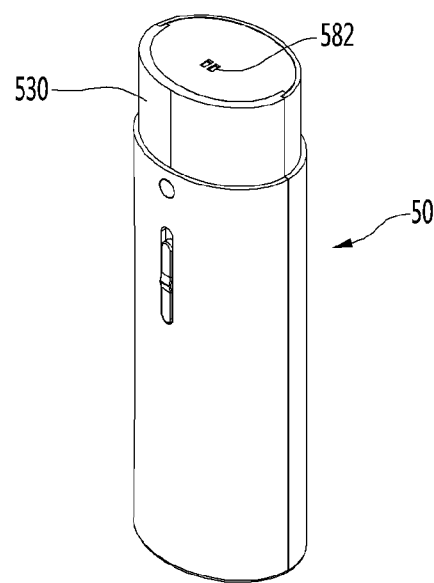
Figure 6:
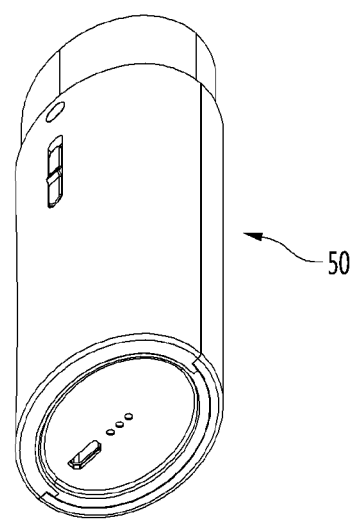

Referring to FIGS. 5-6, the second coupler 530 may be a recessed portion of the handle 50 such that an outer diameter of the second coupler 530 is smaller than an outer diameter of the rest of the handle 50. The first coupler 240 may include a coupling space 242. An inner shape or contour of the first coupler 240 that defines the coupling space 242 may correspond to an outer shape or contour of the second coupler 530. A diameter of the coupling space 242 may be equal to the outer diameter of the second coupler 530.

Each of the first and second couplers 240 and 530 may include at least one magnet. The magnet provided in the first coupler 240 may have a polarity opposite to a polarity of the magnet provided in the second coupler 240. The first and second couplers 240 and 530 may be further secured via magnetic attraction.

Alternatively, one of the first and second couplers 240 and 530 may include a magnet, while the other of the first and second couplers 240 and 530 may include a metal. The magnet of, e.g., the first coupler 240 may be attracted to a ferromagnetic or paramagnetic metal (e.g., iron, nickel, cobalt, or steel) of, e.g., the second coupler 530 to secure the head 20 to the handle 50 and prevent unintended detachment of the head 20 from the handle 50. The head 20 may be pulled off and removed from the handle 50 by the user, but the head 20 may be secured to the handle 50 during use.

The first coupler 240 may include a head or first terminal 264, and the second coupler 530 may include a handle or second terminal 582. When the second coupler 530 is inserted into the coupling space 242 of the first coupler 240, the handle terminal 582 may be in contact with the head terminal 264. Power from a battery 540 (FIG. 7) provided in the handle 50 may be supplied to the light emitting device 223 (FIG. 7) of the head 20 via contact between the head and handle terminals 264 and 582.

The pet care device 1 may further include a base or support 60 to support the main body 10. A lower end of the handle 50 of the main body 10 may be seated on the base 60, and the head 20 may extend upward. However, embodiments disclosed herein are not limited to such a support system; for example, both the head 20 and the handle 50 of the main body 10 may be laid onto a differently configured base 60 or in a storage case. The battery 540 in the handle 50 may be charged when the handle 50 is seated on the base 60. A detailed structure of the base 60 will be described later with reference to FIGS. 25-26.

Referring to FIGS. 7 to 10, the head 20 may include a first and second frames or shells 200 and 250, the sterilizer 220 provided in the first frame 200, and the light diffuser 230 covering the sterilizer 220. The first and second frames 200 and 250 may also be referred to as first and second cases, respectively. The first frame 200 may be a front frame, while the second frame 250 may be a back frame. The first frame 200 may be coupled to the second frame 250 to form an exterior or case of the head 20.

The first frame 200 may constitute a main case or body of the head 20, and may resemble an elliptical shell or case. The first frame 200 may include a first or outer space 212 and a second space 217 partitioned from the first space 212. The first space 212 may be formed by a recession or groove formed along an outer perimeter of the first frame 200, and the sterilizer 220 may be provided in the first space 212. The second space 217 may be an inner space formed defined by a space forming wall 244, and may penetrate the first frame 200. The space forming wall 244 may protrude from the first case 200 toward the second case 250. Pet hair or fur, in addition to dander or other debris, may be collected in the second space 217 during use.

The first space 212 and the sterilizer 220 may surround a portion of the second space 217. Since the second space 217 is partitioned from the first space 212 via the space forming wall 244, an amount of hair and foreign matter flowing into the first space 212 and contacting the sterilizer 220 may be reduced.

The first frame 200 may include an outer body or wall 201 and an inner body or wall 210 positioned inside the outer body 201. The first space 212 may be formed between the outer and inner bodies 201 and 210, while the space forming wall 244 defining the second space 217 may extend from the inner body 210.

The space forming wall 244 may extend from the inner body 210 toward the second frame 250 to contact the second frame 250. The space forming wall 244 may include a pair of straight walls or side walls 245 and 246 extending in a straight line from the inner body 210, and a connection or rounded wall 247 connecting ends of the straight walls 245 and 246 (see FIG. 8). The connection wall 247 may be, for example, a curved wall.

The side walls 245 and 246 and the connection wall 247 may form a truncated elliptical wall extending backward toward the second frame 250, and may form a second opening or inlet of the second space 217. When the first frame 200 is coupled to the second frame 250, the second frame 250 may close or cover a back end of the second space 217.

The inner body 210 may be formed in an ellipse or stadium shape to form a first opening or inlet 214 on an inner side. The first opening 214 may be an inlet to the second space 217. At least a portion of the outer body 201 may be formed in a shape corresponding to a shape of the inner body 210 to surround an outer side of the inner body 210. The outer body 201 and the inner body 210 may be connected by a support wall or a back wall 218.

Figure 9:
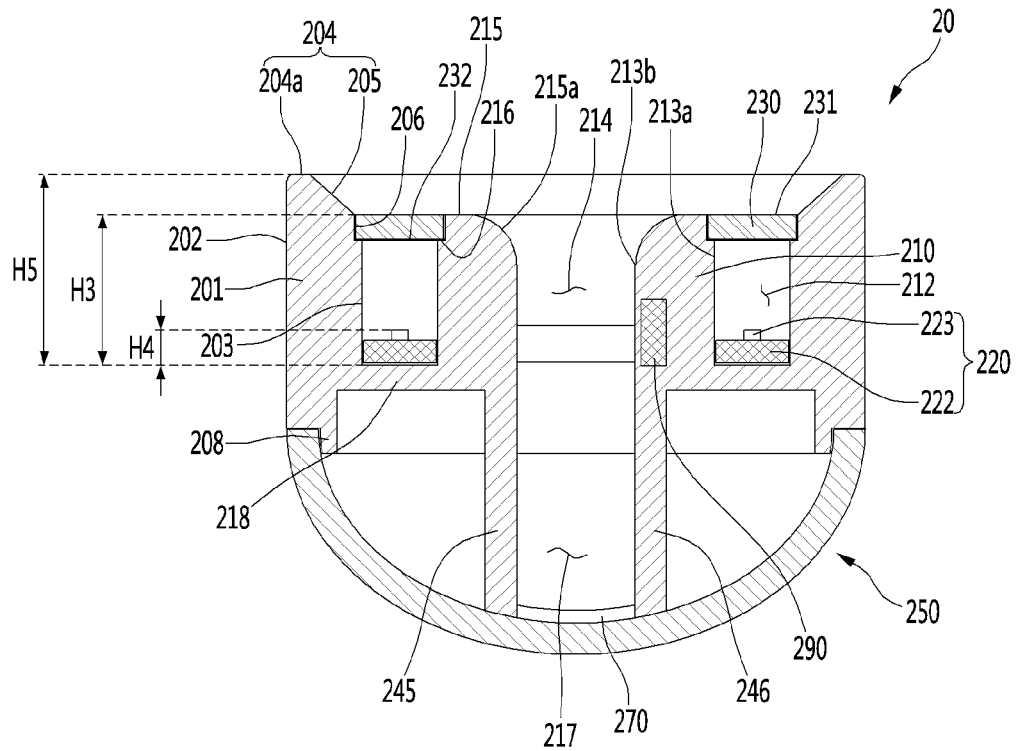
FIG. 9 is a cross-sectional view taken along the line A-A of FIG.
Figure 10:
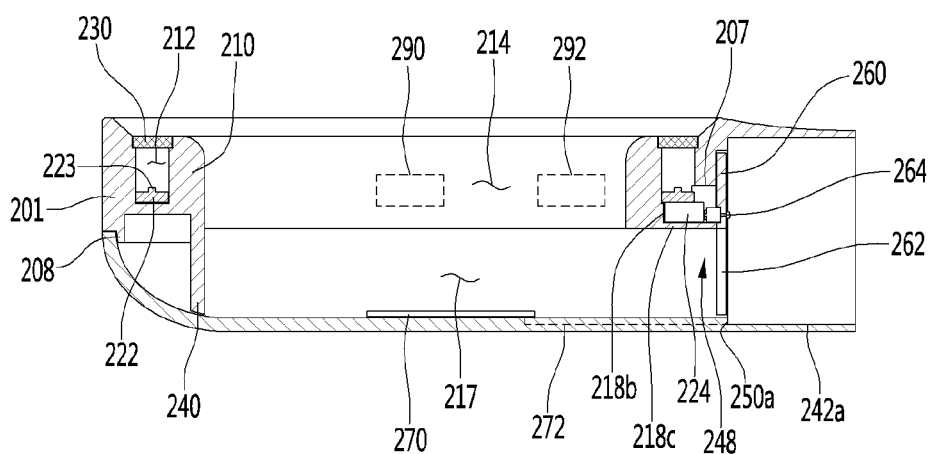
FIG. 10 is a cross-sectional view taken along the line B-B of FIG.

The back wall 218 may also be referred to as a bottom or lower wall with reference to FIG. 9. However, one of ordinary skill in the art should appreciate that, although FIG. 9 shows that a front face of the head 20 is pointed upward and displays the first frame 200 above the second frame 250, during use, the pet care device 1 will most likely not have such an orientation. For example, the user may hold the handle 50 to point a front face of the head 20 downward or sideways onto a body of the pet so that the light device 223 may emit light toward the pet.

Referring primarily to FIG. 9, the support wall 218 may be a back or lower wall of the first space 212. The support wall 218 may extend in a horizontal direction from back or lower sides of the inner body 210 to be connected to the outer body 201. The sterilizer 220 may be mounted on a front or upper surface of the support wall 218. A height H3 from the front surface of the support wall 218 to a front or upper end of the inner body 210 may be formed to be higher than a height H4 of the sterilizer 220.

A front end of the sterilizer 220 may be an end having the light emitting device 223, and a front end of the light emitting device 223 may not contact the inner body 210. The outer body 201 may include an outer circumferential surface 202, an inner circumferential surface 203, and a connection surface or front surface 204 that connects the outer and inner circumferential surfaces 202 and 203.

The outer circumferential surface 202 of the outer body 201 may form an exterior of the head 20, while the inner circumferential surface 203 of the outer body 201 may define the first space 212. A height H5 of the outer circumferential surface 202 may be formed to be higher than a height h3 of the inner circumferential surface 203. The height H5 may be defined by a distance from a horizontal axis aligned with a front surface of the support wall 218 to a front or top end of the outer circumferential surface 202. The height H3 may be defined by a distance from the horizontal axis to a front or top end of the inner circumferential surface 203.

The connection surface 204 may include a horizontal surface 204*a* and an inclined surface 205. The horizontal surface 204*a* may extend in a horizontal direction from the outer circumferential surface 202 of the outer body 201 inward toward the inner circumferential surface 203. The inclined surface 205 may extend from an inner end of the horizontal surface 204*a* toward the front end of the inner circumferential surface 203.

The inner circumferential surface 203 of the outer body 201 may be formed with a first or outer support groove 206 to support the light diffuser 230. The light diffuser 230 may be inserted into and/or seated on the first support groove 206. An outer surface 231 of the light diffuser 230 may be horizontally spaced apart from the outer circumferential surface 202 of the outer body 201. The height h3 of the inner circumferential surface 203 may be equal to a height of a front surface of the light diffuser 230, so the light diffuser 230 may be vertically spaced apart from a surface on which the head 20 is applied, as the higher horizontal surface 204 may contact a pet before the light diffuser 230 may contact the pet. Heights and positions of the outer circumferential surface 202, inner circumferential surface 203, connection surface 204, light diffuser 230, and sterilizer 220 may be configured to facilitate an even distribution of light emitted by the light emitting device 223 toward the pet.

The inner body 210 may include an outer circumferential surface 213*a* and an inner circumferential surface 213*b*. The first space 212 may be formed between the outer circumferential surface 213*a* of the inner body 210 and the inner circumferential surface 203 of the outer body 201. The first opening 214 leading to the second space 217 may be formed within the inner circumferential surface 213*b*. An inner circumferential surface of the space defining wall 244 may extend from the inner circumferential surface 213*b* of the inner body 210.

The inner body 210 may include a connection or front surface 215 connecting a front or top end of the outer circumferential surface 213*a* and a front or top end of the inner circumferential surface 213*b*. The connection surface 215 may include an inclined or curved surface 215*a* that is inclined or curved downward toward the inner circumferential surface 213*b* from the outer circumferential surface 213*a*. As an example, the curved surface 215*a* may be a round or curved surface that is inclined or curved downward from the outer circumferential surface 213*a* toward the inner circumferential surface 213*b*.

The outer circumferential surface 213*a* of the inner body 210 may have a second or inner support groove 216 to support the light diffuser 230. The light diffuser 230 may be seated within the first and second support grooves 206 and 216 to cover the first space 212. Depths of the first and second support grooves 206 and 216 may be configured such that, when the light diffuser 230 is inserted into the first and second support grooves 206 and 216, a front or upper surface 231 of the light diffuser 230 may align with a front or upper surface of the connection surface 215 of the inner body 210.

The light diffuser 230 may be further fused or adhered into the first and second support grooves 206 and 216 to be coupled to the first frame 200. Such fusion may reduce or prevent liquid and other foreign matter flowing into the first space 212.

The horizontal surface 204*a* may be configured to maximize an area of contact between with pet skin, and heights of the horizontal surface 204*a* and the light diffuser 230 may be configured to concentrate light irradiated from the light emitting device 223 toward the pet skin, and to prevent light from being irradiated outward or frontward toward a user's eyes. The inclined surface 205 may also be configured to increase a contact area between the head 20 of the pet care device 1 with the pet and to guard light from the light emitting device 223 from being emitted outward toward the user.

In addition, heights of the horizontal surface 204*a* and the light diffuser 230, along with heights H5 of the outer circumferential surface 202 and H3 of the inner circumferential surface 203, may be configured to prevent the light diffuser 230 from directly contacting the skin of the pet. The light passing through the light diffuser 230 may not be too focused or concentrated at a specific point on the pet skin, which may prevent or reduce unintended stimulation. Such an inward position of the light diffuser 230 that spaces the light diffuser 230 apart from a surface on which the head 20 is applied may also prevent damage to the light diffuser 230 and the sterilizer 220.

The back surface 232 of the light diffuser 230 may face the light emitting device 223 of the sterilizer 220. Heights of the first and second grooves 206 and 216 and the support wall 218, along with heights H3 of the inner circumferential surface 203 and H4 of the sterilizer 220, may be configured such that the back surface 232 of the light diffuser 230 does not contact the light emitting device 223 and/or the sterilizer 220 and such that light emitted by the light emitting device 223 is spread or diffused somewhat before passing through the light diffuser 230. Heights of the first and second grooves 206 and 216, the support wall 218, and the heights H3 of the inner circumferential surface 203 and H4 of the sterilizer 220 may be further configured to ensure an irradiation angle of light from the light emitting device 223 is increased to a predetermined irradiation angle before passing through the light diffuser 230. Light may be evenly transmitted through the light diffuser 230, and an amount light emitted to the pet skin may be increased.

Heights H5 and H3 of the outer and inner circumferential surfaces 202 and 203, in addition to a height of the connection surface 215 and/or a curvature of the curved surface 215a, may be configured to easily gather and collect hair into the second space 217. Hair collected on the connection surfaces 204 and 215 may be guided to the second space 217 by the curved surface 215a.

Referring back to FIGS. 7-10, the first opening 214 may be an inlet at a front face of the pet care device 1. A second opening or inlet 248 to the second space 217 may be formed in a bottom side closer to the handle 50 (or right side with reference to FIGS. 8 and 10). The second opening 248 may be formed between ends of the side walls 245 and 246 of the space forming wall 244 to be opposite the connection wall 247 of the space forming wall 244. The second space 217 may have a bent or L shape.

An ionizer 270 (e.g., plasma ionizer) may provide ions to the second space 217. Ions generated in the ionizer 270 may be emitted into the second space 217 and coated onto pet hair during use through the first opening 214. Plasma ions, when coated on pet hair, may condition and/or maintain moisture in pet hair, reduce static electricity, and reduce fine dust or pet dander. As an example, the ionizer 270 may be installed in the second frame 250 to face the first opening 214, but embodiments disclosed herein are not limited to such a position of the ionizer 270 so long as the ionizer 270 is positioned to emit plasma ions toward the pet. The ionizer 270 may receive power from the 540 battery described later.

The sterilizer 220 may include a printed circuit board (PCB) 222 and a plurality of light emitting devices 223 provided on a surface of the PCB 222. The plurality of light emitting devices 223 may be ultraviolet light emitting diodes (UV LEDs) as described above. The UV LEDs may be irradiated with light of a UVC wavelength. Although not limited, the light emitting device 223 may irradiate a wavelength within a range of 200 to 280 nm (e.g., 260 nm). Alternatively or in addition thereto, the sterilizer 220 may also include at least one LED that emits visible light.

The PCB 222 may be formed in an elliptic or stadium form configured to fit an elliptic shape of the first space 212. The PCB 222 may include a pair of longitudinal extensions or portions 222b and 222c connected by a pair of curved connection portions 222d and 222e. The length of each longitudinal portion 222b and 222c may be formed to be longer than a length of each connection portion 222d and 222e.

An elliptic or stadium shape may help maximize an area where light from the light emitting devices 223 are irradiated. As an example, each of the longitudinal portions 222b and 222c of the PCB may extend in a straight line. However, embodiments disclosed herein are not limited to straight longitudinal portions 222b and 222c, and as another example, the longitudinal portions 222b and 222c may be curved, bent, jagged, etc.

The PCB 222 may surround the inner body 210, and may include an opening 222a through which the inner body 210 passes. The plurality of light emitting devices 223 may be installed on a surface of the PCB 222 and positioned to face (i.e., emit light toward) the light diffuser 230.

A plurality of light emitting devices 223 may be installed in each of the longitudinal portions 222b and 222c. Although not limited, each of the longitudinal extension parts 222b and 222c may be provided with ten or more light emitting devices 223. Each of the connection portions 222d and 222e may also be provided with a plurality of light emitting devices 223. There may be more (e.g., twice as many) light emitting devices 223 provided in each of the longitudinal portions 222b and 222c than in the connection portions 222d and 222e. Alternatively, the number of light emitting devices 223 in each of the longitudinal portions 222b and 222c may be equal to the number of light emitting devices 223 in each of the connection portions 222d and 222e.

The light emitting devices 223 provided in each of the connection portions 222d and 222e may include a first light emitting device 223a and a second light emitting device 223b positioned adjacent to each of the longitudinal portions 222b and 222c. There may be one or more third light emitting devices 223c positioned between the first light emitting device 223a and the second light emitting device 223b.

A number and spacing of third light emitting devices 223c may be configured such that an intensity of light emitted from each of the connection portions 222d and 222e may be equal to or greater than a predetermined intensity. For example, in FIG. 7, three third light emitting devices 223c are provided between the first and second light emitting devices 223a and 223b. However, embodiments disclosed herein are not limited to three third light emitting devices 223c. Since the PCB 222 may be formed in an ellipse shape having curved connection portions 222d and 22d, a spacing between third light emitting devices 223c may be configured to be at equal intervals or angles from each other. The plurality of light emitting devices 223 may be spaced apart from each other to surround the inner body 210.

The sterilizer 220 may further include a first connector 224 connected to the PCB 222. The first connector 224 may be connected to a surface of the PCB 222 that is opposite the surface of the PCB 222 on which the light emitting device 223 is installed. The first connector 224 may be connected to a connection portion 222d that is positioned adjacent to the handle 50 among the pair of connection portions 222d and 222e.

The support wall 218 may be formed with a receiving portion or recess 218b in which the first connector 224 may be provided. The first connector 224 may be silicone coated. A waterproof layer may be formed on an outer side of the first connector 224 by the silicon coating. The support wall 218 may further include a cover wall 218c covering the first connector 224 positioned in the receiving portion 218b. The cover wall 218c may connect the pair of straight walls 245 and 246 of the space forming wall 244. When there is a waterproof layer coated on the outside of the first connector 224, the cover wall 218c may be omitted.

The outer body 201 may further include a slot 207 through which the first connector 224 passes. The head 20 may further include a slot cover 260 that covers the slot 207. The slot cover 260 may divide the second space 217 from the coupling space 242 of the first coupler 240 (FIG. 6). The slot cover 260 may include a hole or opening 262 in communication with the second opening 248 of the second space 217 and also in communication with the coupling space 242 of the first coupler 240. The opening 262 of the slot cover 260 may be aligned with the second opening 248 of the first frame 200, while the slot cover 260 may cover the slot 207.

The slot cover 260 may be provided with the head terminal 264 connected to the first connector 224. When the handle 50 is connected to the head 20, the head terminal 264 may be in contact with the handle terminal 582. The slot cover 260 may further include a supply line 268 to supply power to the ionizer 270. The supply line 268 may be branched from the head terminal 264. The supply line 268 may be made of a conductive material, and may be a wire. The second frame 250 may also be provided with a supply line 272 that connects to the ionizer 270. When the slot cover 260 is coupled to the first and second frames 200 and 250, the supply line 272 of the second frame 250 may be connected to the supply line 268 of the slot cover 260.

The second frame 250 may have a partial cylindrical shell shape that surrounds the space forming wall 244. The outer body 201 of the first frame 200 may be seated on a front end or perimeter of the second frame 250. The first frame 200 and the second frame 250 may be pressed-fit together and further coupled by fusion or adhesion. At lower sides of the first and second frames 200 and 250, the coupling space 242 of the first coupler 240 may be formed.

The slot cover 260 may be coupled to the first frame 200 and the second frame 250 inside the coupling space 242 by fusion or adhesion. The first frame 200 may further include a contact portion or rib 208 contacting an inner surface of the second frame 250. The second frame 250 may include an optional groove in which the rib 208 of the first frame 200 is inserted.

The rib 208 may be formed along a circumference of the outer body 201 of the first frame 200 to increase a contact (e.g., fused or adhered) area between the first and second frames 200 and 250. A bonding or coupling force via the fusion or adhesion may be increased via the rib 208.

The rib 208 and slot cover 260 may be configured so as not to interfere with each other. The slot cover 260 may include a stepped or recessed portion 263 on which the rib 208 may be seated.

In addition, a mounting groove or recess 242a may be formed in an inner surface of the second frame 250. The second coupler 530 may be provided in the mounting groove 242a of the second frame 250 when the handle 50 is coupled to the head 20. A stopper or wall 250a may be formed in the second frame 250 adjacent to the seating groove 242a.

When the second coupler 530 is inserted into the coupling space 242 of the first coupler 240, the second coupler 530 may contact the stopper 250a to couple the first and second couplers 240 and 530. The head 20 may further include a care tool sensor 290 (e.g., hall sensor) to detect a coupling of a care tool described later that may be coupled to the head 20.

As an example, the care tool sensor 290 may be provided in the inner body 210 and oriented toward the second space 217. The care tool sensor 290 may include a hall sensor to detect a magnetic force or attraction of a magnet provided in a care tool described later.

A first fixing device 292 may be provided at a position spaced apart in the longitudinal direction from the care tool sensor 290 in the inner body 210. The first fixing device 292 may be a device (e.g., a metal plate or a magnet) to secure a coupling between the head 20 and one of various care tools described later with reference to FIGS. 13-24. The first fixing device 292 may be oriented toward the second space 217.

Figure 7:
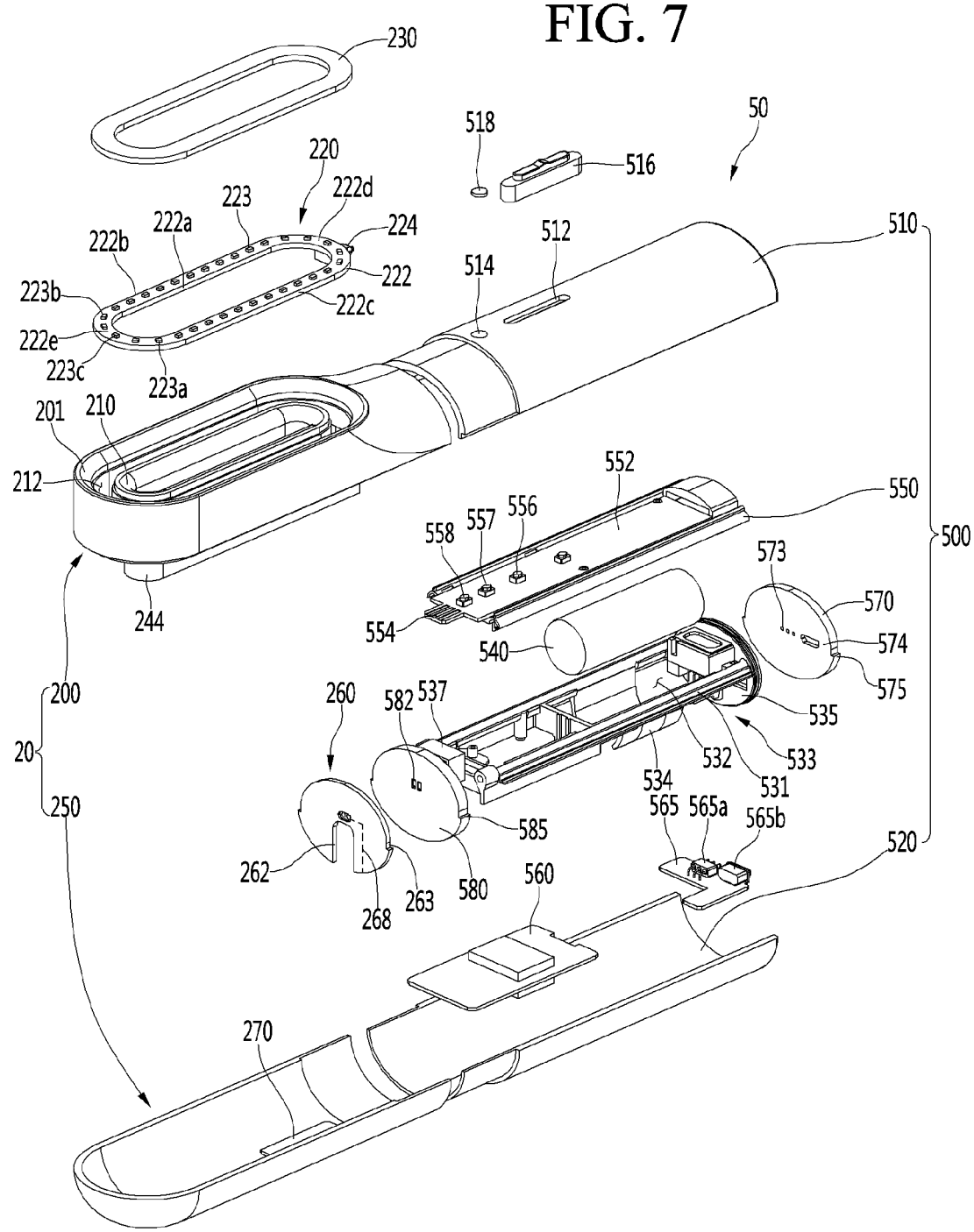
FIG. 7 is an exploded perspective view of the main body according to an embodiment.
Figure 8:
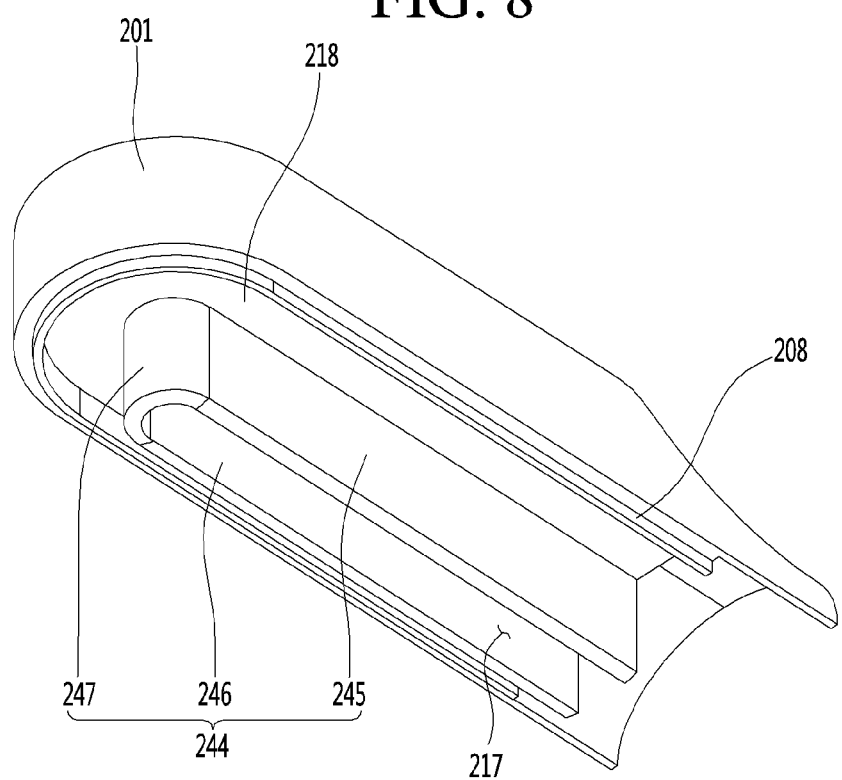
FIG. 8 is a perspective view of a first frame of the head according to an embodiment.
Figure 11:
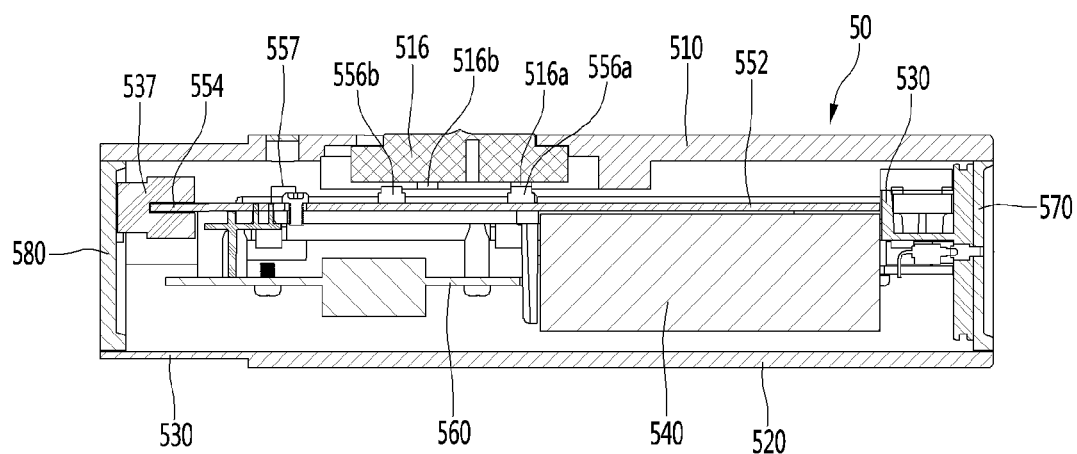
FIG. 11 is a cross-sectional view taken along the line C-C of FIG.
Figure 12:
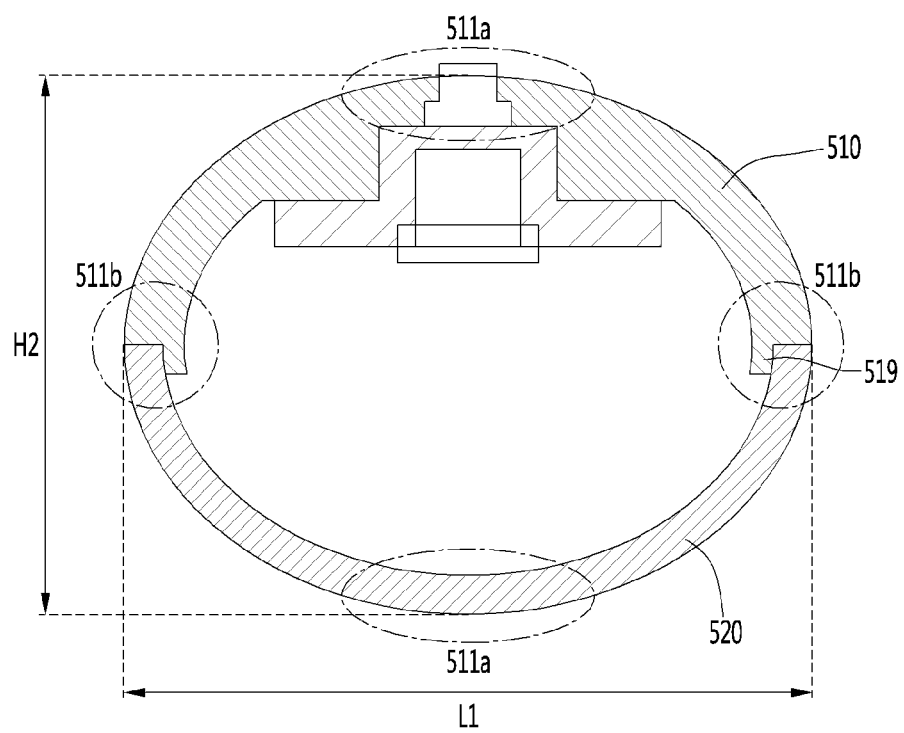
FIG. 12 is a cross-sectional view taken along the line D-D of FIG.

Referring to FIGS. 7 and 11-12, the handle 50 may include a handle body 500 forming an exterior of the handle 50. The handle body 500 may include the second coupler 530 to be coupled to the first coupler 240. The handle body 500 may be formed by first and second handle frames or shells 510 and 520 that are coupled (e.g., pressed-fit, adhered, and/or fused) to each other.

A battery 540 may be provided inside the handle body 500. The battery 540 may be charged by external power applied to the base 60 (FIG. 1) and supplied to the battery 540 when the handle 50 is mounted in the base 60.

Referring to FIG. 12, the first and second shells 510 and 520 of the handle body 500 may appear to be partial elliptical cylindrical shells that together form an elliptical cylindrical shell. A cross-section of the handle body 500 may be an ellipses.

With reference to FIG. 12, a direction in which the first shell 510 and the second shell 520 are coupled may be a height direction, and a direction perpendicular to the height direction may be a left-right direction. However, one of ordinary skill in the art will appreciate that, when the pet care device 1 is being used, the handle 50 may be oriented opposite to an orientation shown in FIG. 12 with the first shell 510 below the second shell 520 or oriented to the side with the first shell 510 to the right of the second shell 520.

With reference to FIG. 12, a horizontal or left and right length L1 of the handle 50 may be greater than a height or thickness H2 of the handle 50. The handle body 500 may include first sides or portions 511a having small or flatter curvatures and second sides or portions 511b having greater or tighter curvatures than the first portion 511a. A distance between two first portions 511a may be shorter than a distance between two second portions 511b. A semi-minor axis of an ellipse shape of the handle body 500 may fall between the first portions 511a, and a semi-major axis of the ellipse shape of the handle body 500 may fall between the second portions 511b. Curvatures of the first and second portions 511a and 511b of the handle body 500 may be configured to allow a user to easily grip the handle 50. A palm of the user may easily lie against the first portion 511a when the first portion 511a has a small curvature or is less curved than the second portion 511b.

Referring back to FIGS. 7-12, an operation device or switch 516 may be provided on the first shell 510. A user may operate the operation switch 516 with a thumb while holding the handle body 500. The operation switch 516 may be slidable in a longitudinal direction of the first shell 510. An operation slot or opening 512 extending in the longitudinal direction may be formed in the first shell 510. The operation switch 516 may be at least partially inserted into the operation slot 512, and the user may slide the operation switch 516 in the longitudinal direction along the operation slot 512 to control an operation of the pet care device 1. The operation switch 516 may be partially located inside the handle body 500, and may partially protrude outside of the handle body 500 through the operation slot 512. The user may turn the sterilizer 220 on and off via the operation switch 516. Alternatively or in addition thereto, when the sterilizer 220 is turned on, an intensity of the sterilizer 220 may be adjusted via the operation switch 516.

The handle 50 may further include a battery support or case 530 that supports the battery 540. The battery case 530 may include a battery frame 531. The battery frame 531 may include an opening or recess 532 that forms a space in which the battery 540 may be positioned.

The battery case 530 may have a plurality of support ribs 534 extending from the battery frame 531 to support the battery 540 within the opening 532. As an example, the plurality of support ribs 534 may extend downward from the battery frame 531 at both sides of the opening 532. In this case, the plurality of support ribs 534 may curve inward to be closer to each other toward at bottom ends so that the battery 540 does not fall through the plurality of support ribs 534.

A curvature of each support rib 534 may be configured to have a same or similar curvature as an outer contour of the battery 540 so that the plurality of support ribs 534 can stably support the battery 540. The battery 540 may be seated inside rounded portions of the plurality of support ribs 534.

The handle 50 may further include a main printed circuit board (PCB) 552 connected to the battery 540 and a PCB holder or frame 550 supporting the main PCB 552. The PCB holder 550 may be coupled to the battery case 530 between, for example, the first handle body 510 and the battery case 530 so that the main PCB 552 is provided in the PCB holder 550 between the battery 540 in the battery case 530 and the operation device 516 in the operation slot 512 of the first handle body 510.

The handle 50 may include a plurality of operation sensors 556 to detect an operation command or position of the operation switch 516. The plurality of operation sensors 556 may be spaced apart from each other in a sliding direction of the operation switch 516 (i.e., the longitudinal direction of the handle body 500).

The plurality of operation sensors 556 may include a first operation sensor 556a that receives an OFF signal or OFF position of the operation switch 516 and a second operation sensor 556b that receives an ON signal or ON position of the operation switch 516. When the operation switch 516 adjusts an intensity of the of the sterilizer 220, there may be a plurality of operation sensors provided between the first and second operation sensors 556a and 556b to detect various signals or positions between the ON and OFF signals.

The first and second operations sensors 556a and 556b may be contact or touch sensors, and may be provided on a front surface of the main PCB to face a back surface of the operation switch 516. The back surface of the operation switch 516 may include a first protrusion 516a configured to contact the first operation sensor 556a at a first position (e.g., the OFF position) of the operation switch 516. The operation switch 516 may further include a second protrusion 516b configured to contact the second sensor 556a at a second position (e.g., the ON position) of the operation switch 516. When the operation switch 516 is moved to the OFF position, the second protrusion 516b may not contact the second sensor 556b, and when the operation switch 516 is moved to the ON position, the first protrusion 516a may not contact the first sensor 556a. A distance between the first and second protrusions 516a and 516b may be less than a distance between the first and second sensors 556a and 556b.

The handle 50 may further include a proximity sensor 557 to detect whether the main body 10 is close to a pet. The proximity sensor 557 may be, for example, a laser or light sensor including a light emitting device and a light receiving device. However, embodiments disclosed are not limited to laser sensors, and the proximity sensor 557 may be, for example, a radar sensor. The proximity sensor 557 may be installed on the main PCB 552. The first handle body 510 may be formed with a hole 514 to transmit the light of the proximity sensor 557. A hole cover, lens, or transmission surface 518 may be provided to cover the hole 514 and protect the proximity sensor 557. When the proximity sensor 557 is a radar sensor, the hole 514 and hole cover 518 may be omitted.

In order to prevent the user's hand from covering the hole cover 518 during gripping, the hole cover 518 may not interfere with the operation slot 512, and may be provided between the operation slot 512 and the second coupler 530. The hole cover 518 may be located closer to the head 20 than the operation switch 516.

The handle 50 may further include a gyro sensor 558 to sense a vertical position or orientation of the handle 50. The gyro sensor 558 may be installed in the main PCB 552, and may sense whether the operation switch 516 faces up or down. The operation switch 516 may be provided at a same side of the main body 10 as the light diffuser 230 so that, when the operation switch 516 faces up, the light diffuser 230 faces up, and when the operation switch 516 faces down, the light diffuser 230 faces down. Alternatively, the operation switch 516 may be provided at a side opposite a side that the light diffuser 230 faces so that the user may easily operate the operation switch 516 with a thumb while point the light diffuser 230 toward the pet. The gyro sensor 558 may determine whether the operation switch 516 faces up or down, and when the operation switch 516 faces up, the light diffuser 230 may face down, and when the operation switch 516 faces down, the light diffuser 230 may face up.

The sterilizer 220 may be controlled based on information detected by the gyro sensor 558. Alternatively or in addition thereto, the sterilizer 220 may be controlled based on information detected by the proximity sensor 557.

The main PCB 552 may include a connection insert or signal transfer device 554, and the connection insert 554 may be connected to (e.g., inserted into) a second connector 537. The second connector 537 may transfer or transmit a control signal generated by the main PCB 552 to the PCB 222 and/or the supply lines 268 and 272 of the head 20. Alternatively or in addition thereto, the second connector 537 may transfer power or electricity supplied from the main PCB 552 to the PCB 222 and/r the supply lines 268 and 272 of the head.

The handle 50 may further include an auxiliary or secondary PCB 560. The auxiliary PCB 560 may determine whether a care tool is coupled to the head 20 based on a signal output from the care tool sensor 290 of the head 20. Alternatively, the auxiliary PCB 560 may receive signals from the proximity and gyro sensors 557 and 558, analyze the signals, and output an analysis. In addition or alternatively thereto, the auxiliary PCB 560 may receive control signals generated by the main PCB 560 via the second connector 537.

The auxiliary PCB 560 may be coupled to the battery case 530 at a side opposite a side that the main PCB 552 is coupled to the battery case 533. As an example, the main PCB 552 may be coupled to a front side of the battery case 533, and the auxiliary PCB 560 may be coupled to a back side of the battery case 533.

The main PCB 552 and the auxiliary PCB 560 may be collectively referred to as a controller. The controller may supply power of the battery 540 to the sterilizer 220. The controller may adjust a power supply to the sterilizer 220 based on whether the head 20 is mounted to the handle 50 and/or based on information sensed by the sensors 557 and 558.

The handle 50 may further include a charging PCB 565 the battery 540. The charging PCB 565 may include a first charging connector 565a and a second charging connector 565b, but any one of the first charging connector 565a and the second charging connector 565b may be omitted.

The first charging connector 565a may be a terminal that is connected to a supporter or base terminal 612 (FIG. 25) provided in the base 60 to receive a charging voltage. The first charging connector 565a may, for example, include a plurality of electrodes that electrically couple to electrodes of the base terminal 612. When the handle 50 of the main body 10 is seated on the base 60, the first charging connector 565a may contact the base terminal 612 to enable the charging of the battery 540. Details of the base 60 will be described later with reference to FIGS. 25-26.

The second charging connector 565 may be a port or inlet to receive power directly. A charging cable (e.g., a Universal Serial Bus or USB charging cable) may be connected to the second charging connector 565*b* at a first end. A second end of the charging cable may be connected to an outlet or a device for power supply. When the charging cable is connected to the second charging connector 565*b*, it is possible to charge the battery 540 even while using the main body 10 of the pet care device 1. The second charging connector 656 is not limited to a USB port (mini-USB, a micro-USB, a Type A USB, a Type B USB, a Type C USB, a Mini A USB, a Mini B USB, a Micro A USB, a Micro B USB, a Micro AB USB, a USB 2.0, a USB 3.0, etc.), and may be a port compatible with a high definition multimedia interface (HDMI), an Apple Lightning interface, a 30-pin interface, an 8-pin interface, etc.

The charging PCB 565 may be installed in a PCB installation frame 535 provided in the battery case 530. A receiver for wireless charging may be provided inside or outside of the PCB installation frame 535. The receiver may be electrically connected or coupled to the charging PCB 565. The receiver may include a receiving coil. The battery 540 may be supplied with power through the respective charging connectors 565*a* and 565*b* or may be wirelessly charged via the receiver. The receiver may be wirelessly charged through a separate wireless charging device that may include a transmitter having at least one transmitting coil. The transmitter may be provided around the main body 10, may be provided in the base 60, or may be provided in a separate charging pad.

Alternatively, both the first charging connector 565*a* and the second charging connector 565*b* may be omitted, and the handle 50 may include only the receiver. As another alternative, the handle 50 may be provided with any one of the a receiver, the first charging connector 565*a* and the second charging connector 565*b*.

When the first and second shells 510 and 520 are coupled, top and bottom ends of the handle body 500 may have openings. Recessed portions of the first shell 510 and second shells 520 may form first and second sides of the second coupler 530. The handle 50 may further include a first (e.g., bottom) handle cover 570 and a second (e.g., top) cover 580 that cover top and bottom openings of the handle body 500.

The first and second covers 570 and 580 may be separately formed to be coupled to the handle body 500. Alternatively, at least one of the first cover 570 and the second cover 580 may be integrally formed with the handle body 500. When the first cover 570 and the second cover 580 are formed separately, the first cover 570 and the second cover 580 may be fused or adhered to bottom and top ends, respectively, of the first and second shells 510 and 520 of the handle body 500.

The first cover 570 may cover the bottom opening of the handle body 500 and inserted into the base 60. The second cover 580 may cover a top opening of the second coupler 530. The first cover 570 may include first and second connector slots 573 and 574 through which the first and second charging connectors 565*a* and 565*b* may pass or be exposed. A shape of the first connector slot 573 may correspond to shapes or outer contours of electrodes in at least one of the first charging connector 565*a* or the base terminal 612, and a shape of the second connector slot 574 may correspond to a shape or an outer contour of the USB port of a second charging connector 464*b* and/or a charging cable.

The second cover 580 may include the handle terminal 582. The handle terminal 582 may be connected to the second connector 537, and the second cover 580 may contact the slot cover 260 when the head 20 is coupled to the handle 50.

Side ends or edges of the first and second shells 510 and 520 may be adhered or fused to each other. The first shell 510 may include a rib 519 configured to protrude downward inside of the second shell 520. A partial groove may be formed at an outer side surface of the rib 519, and the side edge of the second shell 520 may be configured to fit within the partial groove. The rib 519 may provide a contact surface or area that is adhered or fused to the second shell 520. The rib 519 may be formed along the side edge of the first shell 510. The rib 519 may be configured to increase the contact area between the first and second shells 510 and 520 to increase a bonding or fusing force between the first and second shells 510 and 520. Each of the first cover 570 and the second cover 580 may recessed or stepped portions 575 and 585, respectively, which the rib 519 may be seated on.

A method of using and controlling the main body 10 of the pet care device 1 will be described. The user may hold or grip the handle 50 of the main body 10 and orient the handle 50 such that the light diffuser 230 of the head 20 faces the skin of the pet so that light from the sterilizer 220 may reach the pet skin. The user may also input a command to turn the sterilizer 220 on or off via the operation switch 516.

When the user inputs an ON command by sliding the operation switch 516 to the ON position, the controller may determine whether an ON condition of the sterilizer 220 is satisfied instead of immediately controlling the light emitting device 223 of the sterilizer 220 to turn on. The controller may control the light emitting device 223 of the sterilizer 220 to turn ON once the ON condition of the sterilizer 220 is satisfied.

The ON condition of the sterilizer 220 may be satisfied when the light diffuser 230 and/or the light emitting device 223 faces down and when the main body 10 is within a predetermined distance range from the pet. The controller may determine that the light diffuser 230 faces down based on an orientation of the operation switch 516 sensed by the gyro sensor 558.

When the light diffuser 230 is on the same side as the operation switch 516, the ON condition of the sterilizer 220 may be satisfied when the gyro sensor 558 senses that the operation switch 516 faces down and when the proximity sensor 557 senses that a pet or a pet's skin is within a predetermined distance range from the main body 10. Alternatively, when the light diffuser 230 is on a side opposite the operation switch 516, the ON condition of the sterilizer 220 may be satisfied when the gyro sensor 558 senses that the operation switch 516 faces up and when the proximity sensor 557 senses that a pet or a pet's skin is within the predetermined distance range from the main body 10.

When the proximity sensor 557 uses light to sense a location of the pet, the controller may determine whether an amount or intensity of light received by the light receiving device of the proximity sensor 557 is greater than or equal to a reference value or a predetermined light amount or intensity. The ON condition of the sterilizer 220 may be satisfied when the amount or intensity of light received by the light receiving device is greater than or equal to the reference value or the predetermined light amount or intensity and when the distance between the main body 10 and the pet is less than or equal to the predetermined distance range.

When the controller waits until the ON condition of the sterilizer 220 is satisfied before turning on the light emitting device 223 of the sterilizer 220, the light emitting device 223 of the sterilizer 220 may be prevented from being turned on in a state where the light diffuser 230 of the head 20 faces upward even if the user switches the operating switch 516 to an ON position. When the operating switch 516 is at an ON position when the light diffuser 230 of the head 20 faces upward, light emitted from the light emitting device 223 of the sterilizer 220 may be prevented from harming a user's eyes, a risk of eye damage or eye fatigue may be reduced. In addition, even when the light diffuser 230 of the head 20 is directed downward, if the main body 10 is not close to a pet, the light emitting device 223 of the sterilizer 220 may not be turned on unnecessarily.

At least one of the gyro sensor 558 and the proximity sensor 557 may be omitted, and the controller may determine an ON condition only via one of the gyro and proximity sensors 558 and 557. As an example, when the gyro sensor 558 is omitted, the ON condition may be satisfied when the amount of light received by the light receiving device of the proximity sensor 557 is greater than or equal to the reference value or the predetermined amount or intensity.

Alternatively, when the ON command of the operation switch 516 is input, the controller may control the light emitting device 223 of the sterilizer 220 to emit light at a first intensity. In such a case, the ON condition may be called a NORMAL condition, and when the NORMAL condition of the sterilizer 220 is satisfied, the light emitting device 223 may control the sterilizer 220 to irradiate light at a second intensity greater than the first intensity. An intensity may be varied by varying an individual intensity of the light emitting device 223, or by varying a number of light emitting devices 223 that are turned on among the plurality of light emitting devices 223.

Not only may the head 20 be separated from the handle 50, the head 20 may be coupled to various care tools having various structures and functions. Hereinafter, various care tools that can be coupled to the head 20 and used in combination with the main body 10 will be described.

Referring to FIGS. 13 to 16, a first care tool 70 may be detachably coupled to the main body 10. As an example, the first care tool 70 may be a wide-toothed comb or brush configured to emit light from the sterilizer 220.

The first care tool 70 may be detachably coupled to the head 20. When the first care tool 70 is coupled to the head 20, light emitted from the sterilizer 220 may be guided to the first care tool 70, and the first care tool 70 may be moved along the pet. Light may be transmitted to a side or end of the first care tool 70 that faces the pet.

The first care tool 70 may include a plate-shaped tool body 710 and a head coupler 720 extending from the tool body 710 to couple to the head 20. The tool body 710 may have an elliptic shape corresponding to an elliptic shape of the light diffuser 230 and/or the head 20, and may further include an opening 712 configured to overlap with the opening 222a and the second space 217 of the head 20. The opening 712 may also have an elliptical shape.

The first care tool 70 may include a plurality of protrusions or teeth 714 protruding away from the head coupler 720. The teeth 714 may serve as light guides to guide light from the light diffuser 230 to the pet. The teeth 714 may be provided to surround the opening 712 of the tool body 710.

The tool body 710 may include a pair of longitudinal extensions or portions 710a and 710b corresponding to the longitudinal portions 22b and 222c of the sterilizer 220. The tool body 710 may further include a pair of curved connection portions 710c and 710d connecting the pair of longitudinal portions 710a and 710b. The connection portions 710c and 710d may correspond to the connection portions 222d and 222e of the sterilizer 220.

Each of the longitudinal extensions 710a and 710b may extend in a straight line. A length of each of the longitudinal portions 710a and 710b may be longer than a length of each of the connection portions 710c and 710d.

Some of the teeth 714 may extend from each of the longitudinal portions 710a and 710b, and some of the teeth 714 may extend from each of the connection portions 710c and 710d. The number of teeth 714 installed in each of the longitudinal portions 710a and 710b may be greater than the number of teeth 714 provided in the connection portions 710c and 710d. A number of teeth 714 may correspond to a number of light emitting devices 223 in the sterilizer 220, and may be arranged at positions corresponding to the light emitting devices 223.

Figure 13:
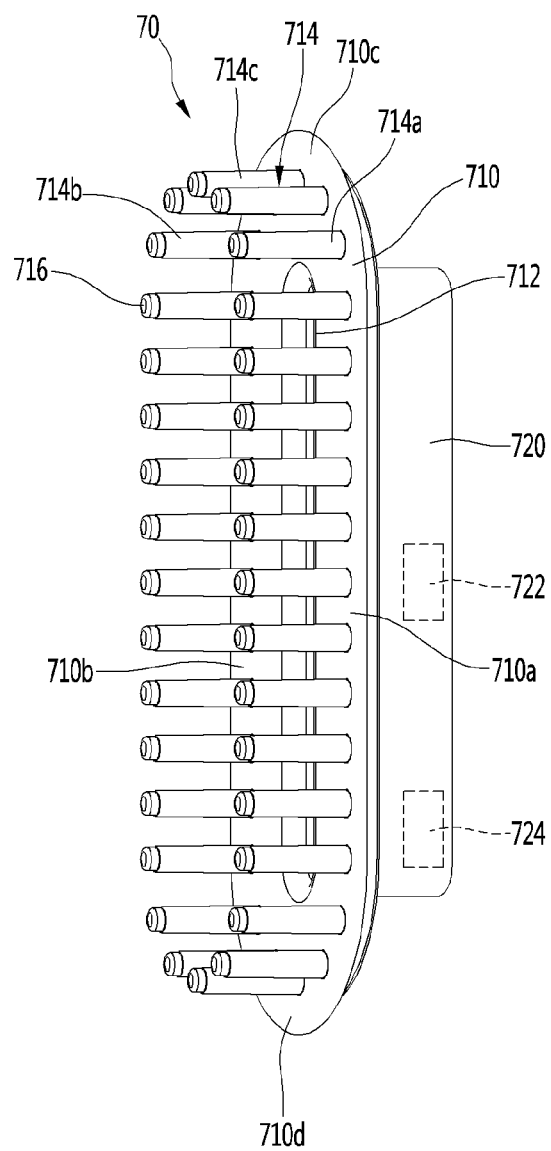
FIGS. 13 and 14 are perspective views of a first care tool.
Figure 14:
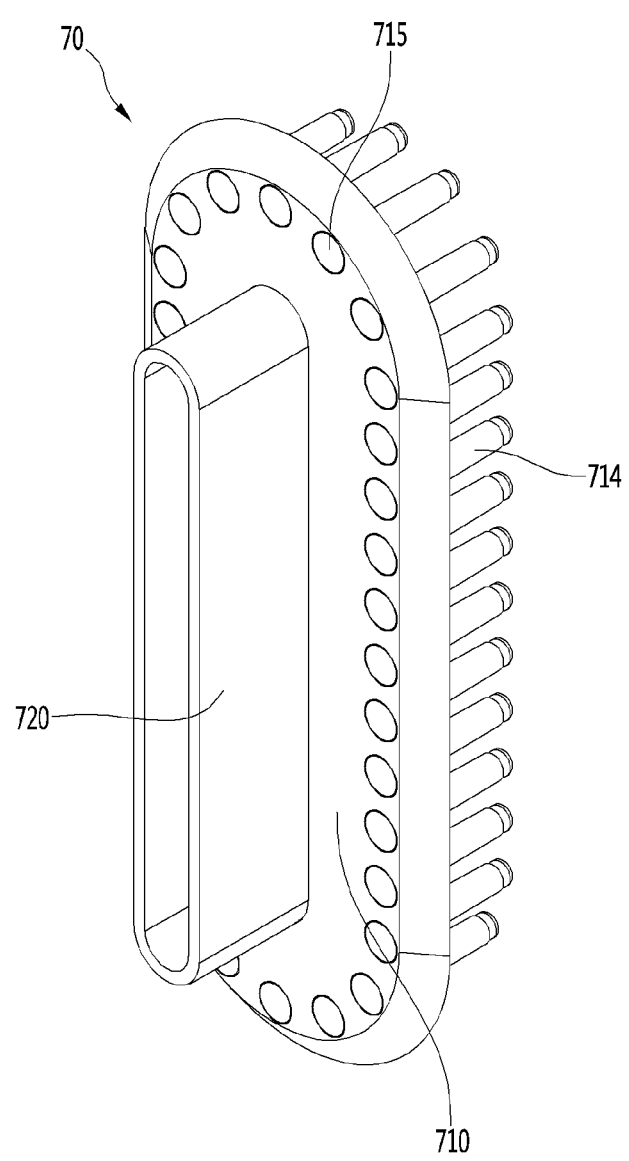
Figure 15:
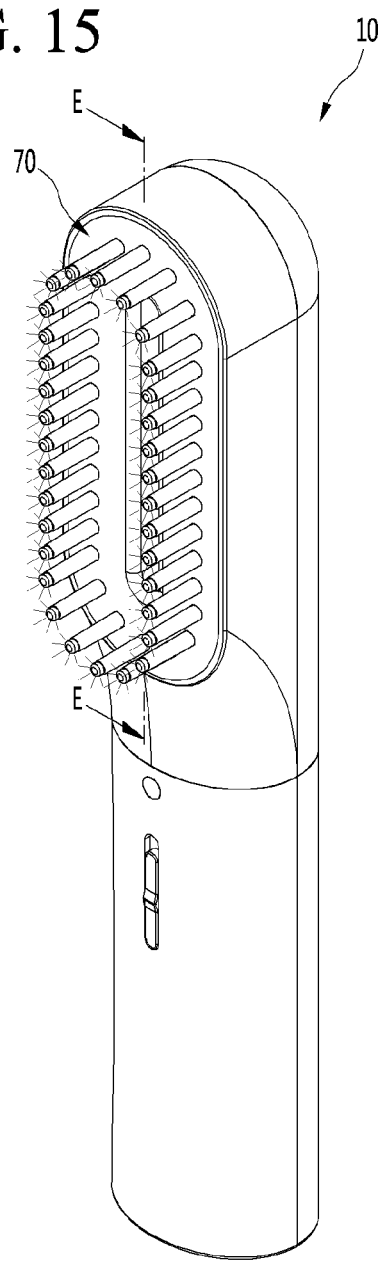
FIG. 15 is a perspective view showing a state in which the first care tool is coupled to the main body.

A first tooth 714a and a second tooth 714b may be provided on each of the connection portions 710c and 710d to be adjacent to each of the longitudinal portions 710a and 710b. At least one third tooth 714c may be positioned between the first and second teeth 714a and 714b. A plurality of third teeth 714c may be provided between the first and second teeth 714a and 714b. As an example, FIG. 13 shows three third teeth 714c provided between the first and second teeth 714a and 714b.

When the first care tool 70 is coupled with the head 20, each of the plurality of teeth 714 may be aligned with a light emitting device 223 among the plurality of light emitting devices 223 of the sterilizer 220. For example, the first tooth 714a may align with the first light emitting device 223a, the second tooth 714b may be aligned with the second light emitting device 223b, and the third teeth 714c may align with the third light emitting devices 223c.

The plurality of teeth 714 may be integrally formed with the tool body 710. A plurality of light collecting surfaces, light guides, or lenses 715 may be provided in the longitudinal and connection portions 710a, 710b, 710c, and 710c to collect and/or focus light. The light collecting surfaces 715 may be provided to correspond to bottom ends of the teeth 714, and may align with the light emitting devices 223. A number of light collecting surfaces 715 may be equal to a number of teeth 714 and the number of light emitting devices 223.

The light collecting surfaces 715 may include a recessed or concave surface that is recessed frontward from a back surface 711b of the tool body 710. The teeth 714 may protrude from a front surface 711a of the tool body 710. The front surface 711a may be referred to as a first surface, and the back surface 711b may be referred to as a second surface that is opposite the first surface. Light irradiated from each light emitting device 223 of the sterilizer 220 may be irradiated to each of the teeth 714 of the first care tool 70 through the light collecting surfaces 715.

Alternatively, the number of teeth 714 and light collecting surfaces 715 may not be equal to the number of the light emitting devices 223 of the sterilizer 220. As an example, there may be two light emitting devices 223 that emit light into a single lens 715 and tooth 714 among the plurality of light collecting surfaces 715 and teeth 714. As another example, there may be one single recessed groove formed in a center of the tool body 710 that serves as a single light collecting surface or lens 715. As another example, some of the teeth 714 may not align with a light collecting surface 715 and/or light emitting device 223.

Figure 16:
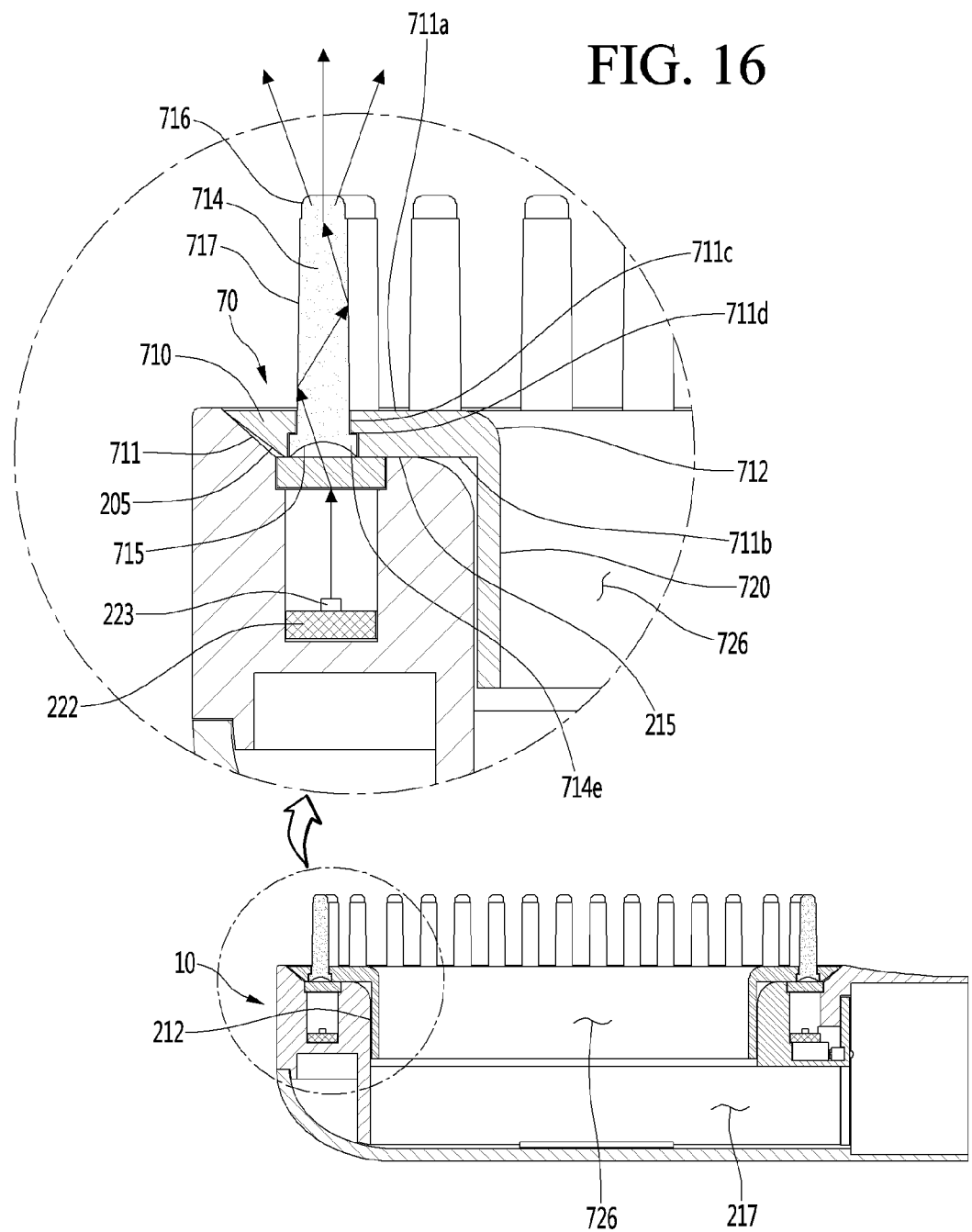
FIG. 16 is a cross-sectional view taken along the line E-E of FIG. 15.
Figure 17:
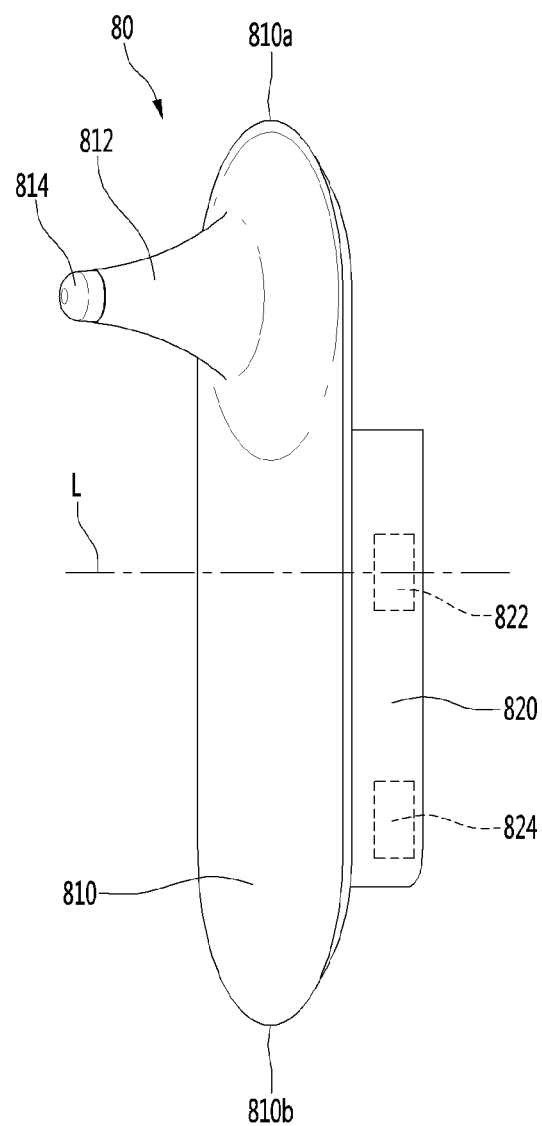
FIGS. 17 and 18 are perspective views of a second care tool.
Figure 18:
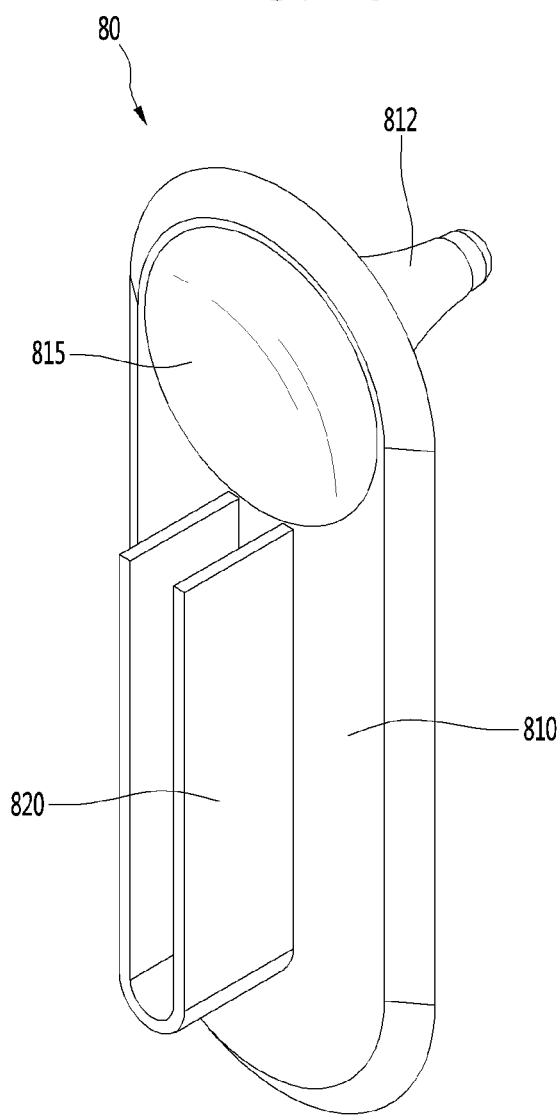
Figure 19:
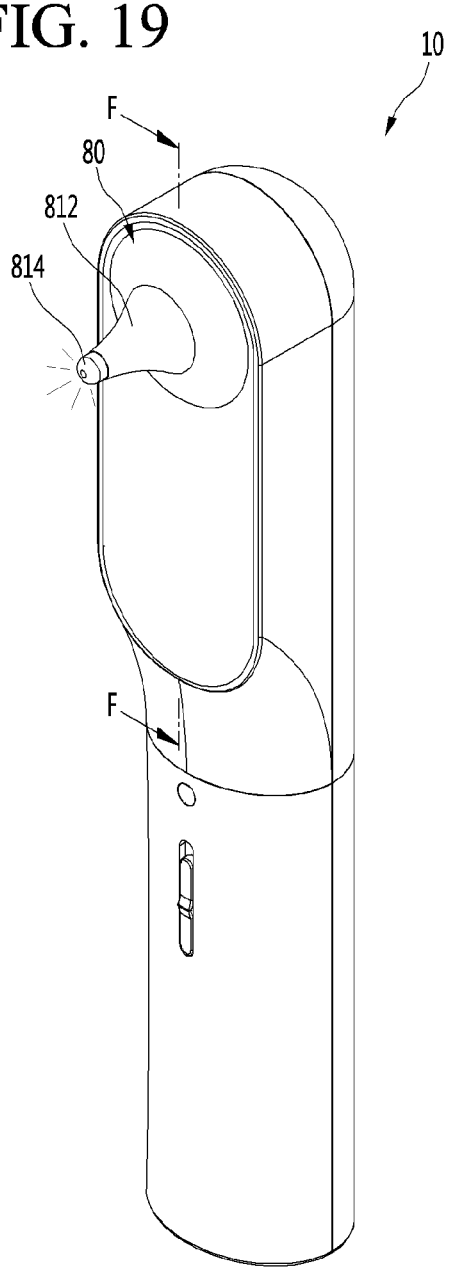
FIG. 19 is a perspective view showing a state in which the second care tool is coupled to the main body.
Figure 20:
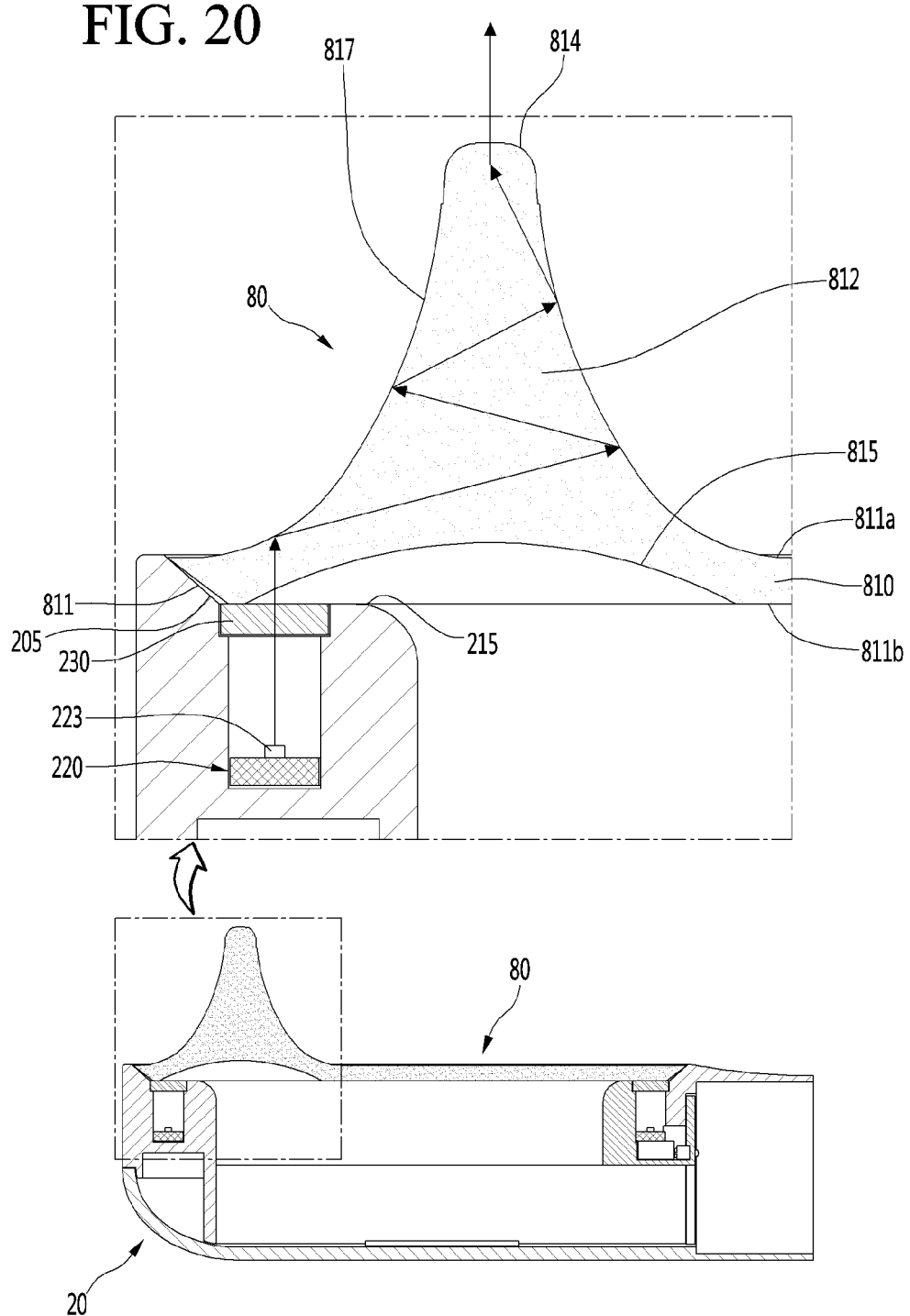
FIG. 20 is a cross-sectional view taken along the line F-F of FIG. 19.

As another alternative, referring to FIG. 16, the plurality of teeth 714 may be manufactured separately from the tool body 710 and coupled to the tool body 710. The tool body 710 may include a hole 711c penetrating the front and back surfaces 711a and 711b. The plurality of teeth 714 may be inserted through the hole 711c at the back surface 711b to protrude out of the front surface 711a.

Each tooth 714 may include a stepped portion 714e having a larger diameter than a portion of the tooth 714 that extends beyond the front surface 711a. The stepped portion 714e may be provided at a lower most portion or end of the tooth 714. The tool body 710 may have a corresponding lock 711d, which may be a stepped portion corresponding to the stepped portion 714e of the tooth 714.

Instead of being formed in the tool body 710, the light collecting surfaces 715 may alternatively be formed on a back surface of the teeth 714 that faces the light diffuser 230. The light collecting surface 715 may be formed within the stepped portion 714e to be recessed in a direction away from the light diffuser 230. The light collecting surface 715 may be a concave surface facing the light diffuser 230.

Referring back to FIGS. 13-16, when the plurality of teeth 714 are integrally formed with the tool body 710, the plurality of teeth 714 and the tool body 710 may be formed of a light transmissive material (e.g., a transparent or translucent material). Alternatively, as shown in FIG. 16, the plurality of teeth 714 and the tool body 710 may include a coating layer 717 that blocks light so that the light emitted from the sterilizer 220 is irradiated only from ends of the plurality of teeth 714. The coating layer 717 may initially cover the entire surfaces of the teeth 714, and then ends of the teeth 714 may be laser engraved to remove the coating layer 717. Ends where the coating layer 717 is removed may be referred to as transmission ends 716.

The coating layer 717 may be reflective. Light irradiated from the light emitting device 223 of the sterilizer 220 may be reflected by the coating layer 717 in teeth 714 and guided to the transmission end 716 to ultimately reach the pet.

If the plurality of teeth 714 are initially formed separately from the tool body 710, the plurality of teeth 714 may be formed of a light transmissive (i.e., transparent or translucent) material, and the tool body 710 may be formed of an opaque or light impermeable material. The plurality of teeth 714 may be coated with the coating layer 717, and transmission ends 716 may be laser engraved to remove the coating layer 717.

The first care tool 70 may be used to comb pet hair by running the teeth 714 through the pet hair. In addition, the plurality of teeth 714 may have a predetermined length configured such that the transmission ends 716 may contact pet skin during combing. Light may be irradiated through the transmission end 716 to the pet skin.

The head coupler 720 may protrude from the back surface 711b of the tool body 710. The head coupler 720 may extend from a circumference of the opening 712 of the tool body 710 and may have an elliptic shape. The head coupler 720 may include a tool space 726 that communicates with the opening 712 of the tool body 710. The opening 712 of the tool body 710 may serve as an inlet to the tool space 726.

The head coupler 720 have a shape configured to correspond to a shape or inner contour of the inner body 210 of the head 20. The head coupler 720 may be inserted into the first opening 214 of the inner body 210 to be provided within the second space 217. When the head coupler 720 is inserted into the inner body 210 of the head 20, the tool space 726 of the head coupler 720 may communicate with the second space 217. During combing, hairs may be separated from the pet and may flow through the opening 712 and the tool space 726 to gather in the second space 217.

The inner body 210 may also be referred to as a tool coupler. The head coupler 720 may include a magnet 722 having a first magnetic force. When the head coupler 720 of the first care tool 70 is inserted into the inner body 210, the care tool sensor 290 may sense a magnetic force equal to the first magnetic force of the magnet 722, and the controller may determine that the first care tool 70 is mounted on the main body 10. When the controller determines that the first care tool 70 is coupled to the inner body 210, the controller may control the sterilizer 220 such that all of the light emitting devices 223 among the plurality of light emitting devices 223 are turned on. The controller may further supply power to the ionizer 270 to operate the ionizer 270.

The head coupler 720 may be provided with a second fixing portion 724 configured to interact with the first fixing portion 292 of the inner body 210. The first and second fixing portions 292 and 724 may further secure a coupling of the first care tool 70 to the head 20.

The second fixing portion 724 may include a magnet or a metal. As an example, the first fixing portion 292 may be a metal (e.g., a ferromagnetic metal or paramagnetic metal), and the second fixing portions 724 may be a magnet that attracts to the metal. Alternatively, the first fixing portion 292 may be a magnet, and the second fixing portion 724 may be a metal that attracts to the magnet in the first fixing portions 292.

As another alternative, the first fixing portion 292 may include a magnet having a first pole or polarity, and the second fixing portion 725 may include a magnet having a second pole or polarity opposite the first pole or polarity to attract to the magnet in the first fixing portion 292.

The head coupler 720 may not have to perfectly fit within the inner body 210 to be coupled to the inner body 210, as magnetic attraction between the first and second fixing portions 292 and 724 may secure the head coupler 720 to the inner body 210.

The tool body 710 may be seated on the connection surface 215 of the inner body 210. The tool body 710 may further include an inclined surface 711 configured to rest on the inclined surface 205 of the outer body 201.

The first care tool 70 may be coupled to the main body 10, and after use, the first care tool 70 may be separated from the head 20. Hairs gathered in the second space 217 in the head 20 may be easily discarded when the first care tool 70 is pulled and separated from the head 20 and when the head 20 is further pulled and separated from the handle 50. As an alternative, a pet care device 1 may be formed of a head 20 formed integrally with the first care tool 70, and the head 20 and first care tool 70 may together be pulled and separated from the handle 50 to discard the hair gathered in the second space 217.

Referring to FIGS. 17 to 20, a second care tool 80 may be detachably coupled to the head 20 of the main body 10. The second care tool 80 may be, for example, an otoscope or probe to inspect or treat an ear of the pet.

The second care tool 80 may include a plate-shaped tool body 810 and a head coupler 820 extending from the tool body 810 to for couple with the head 20. The tool body 810 may have an elliptic shape corresponding to an elliptic shape of the light diffuser 230 and/or the head. The tool body 810 may include first and second ends 810a and 810b corresponding to the connection portions 222d and 222e of the sterilizer 220. The tool body 810 may include a first or front surface 811a and a second or back surface 811b opposite to the front surface 811a.

The front surface 811a of the tool body 810 may be provided with an insertion portion or probe 812 protruding outward. The probe 812 may protrude in a direction away from the back surface 811b on the first surface 811a. The probe 812 may have a width or cross-sectional area that decreases from the front surface 811a outward. The probe 812 may, for example, be formed in a conical or trumpet shape configured to be inserted into the ear of the pet.

The probe 812 may be located closer to the first end 810a than the second end 810b. Although not limited, an axis or imaginary line L may bisect the second care tool 80 into first and second portions or sides. The first end 810a may be provided on the first side and the second end 810b may be provided on the second side. The second end 810b may be located closer to the handle 50 than the first end 810a when the second care tool 80 is attached to the head 20. The probe 812 may be located closer to the first end 810a than the line L.

Similar to the tool body 710 of the first care tool 70, the tool body 810 may have an inclined surface 811 sated on the inclined surface 205 of the outer body 201, and the back surface 811b may be seated on the connection surface 215 of the inner body 210. Unlike the first care tool 70, however, the tool body 810 may not have openings, and so a portion of the back surface 811b may cover the first opening 214 and the second space 217 of the inner body 210. Hair of the pet may not be drawn into the first opening 214 and gathered in the second space 217 head during use.

An edge of the back surface 811b of the tool body 810 may be seated on and face the light diffuser 230. A light collecting surface, light guide, or lens 815 may be formed to be recessed in the second surface 811b at a portion behind the probe 812. The light collecting surface 815 may be a concave surface that is recessed in a direction away from the light diffuser 230, and may align with the light diffuser 230 and the first opening 214. Light emitted from the light emitting devices 223 and passing through the light diffuser 230 may also pass through the light collecting surface 815.

The tool body 810 and the probe 812 may be formed of a light transmissive material (i.e., a translucent or transparent material). Outer surfaces of the tool body 810 and the probe 812 may be coated in a coating layer 817 to block light, and a transmission end 814 of the probe 812 may be laser engraved to remove the coating layer 817 at the transmission end 814. Light emitted by the light emitting device 223 and passing through the light diffuser 230 and the light collecting surface 815 may only pass to the pet through the probe 812 at the transmission end 814.

The coating layer 817 may further be a reflective layer, and the coating layer 817 may be further coated on an inner surface of the probe 817. Light irradiated from the light emitting device 223 of the sterilizer 220 may be reflected by the coating layer 817 in the probe 812 and guided to the transmission end 814 to be emitted toward the pet. Since the transmissive end 814 of the probe 812 may be inserted into the ear of the pet, the light transmitted through the transmission end 814 can be transferred into the ear of the pet and treat the ear.

A coupling of the head coupler 820 to the inner body 210 may be substantially similar to a coupling between the head coupler 720 of the first care tool 70 and the inner body 210. The head coupler 820 may include a magnet 822 having a second magnetic force different in magnitude from the first magnetic force. The controller may determine that the second care tool 80 is coupled to the head 20 when the care tool sensor 290 senses the second magnetic force from the magnet 822 of the second care tool 80.

When the controller determines that the second care tool 80 is mounted, the controller may control the sterilizer 220 such that at least some of the light emitting devices 223 are turned on. As an example, only light emitting devices positioned adjacent to the probe 812 or the first end 810a may be turned on. As another example, only light emitting devices 223 provided behind the light collecting surface 815 may be turned on.

Even if all of the light emitting devices 223 are turned on, only light irradiated from the light emitting devices 223 behind the probe 812 may be guided to the transmission end 814. As such, keeping some of the light emitting devices 223 turned off may prevent unnecessary power consumption.

The head coupler 820 may include a second fixing portion 824 for interacting with the first fixing portion 292 of the inner body 210. Like the second fixing portion 724 of the first care tool 70, the second fixing portion 824 may be a magnet or a metal interacting with a magnet or metal of the first fixing portion 292, and the first and second fixing portions 292 and 824 may secure a coupling of the second care tool 80 to the head 20 via magnetic attraction.

As another example, the main body 10 and the second care tool 80 may be formed to be integrated. In such a case, the plurality of light emitting devices 223 may only be provided only in a portion of the head 20 that is adjacent to the probe 812 of the second care tool 80.

Figure 21:
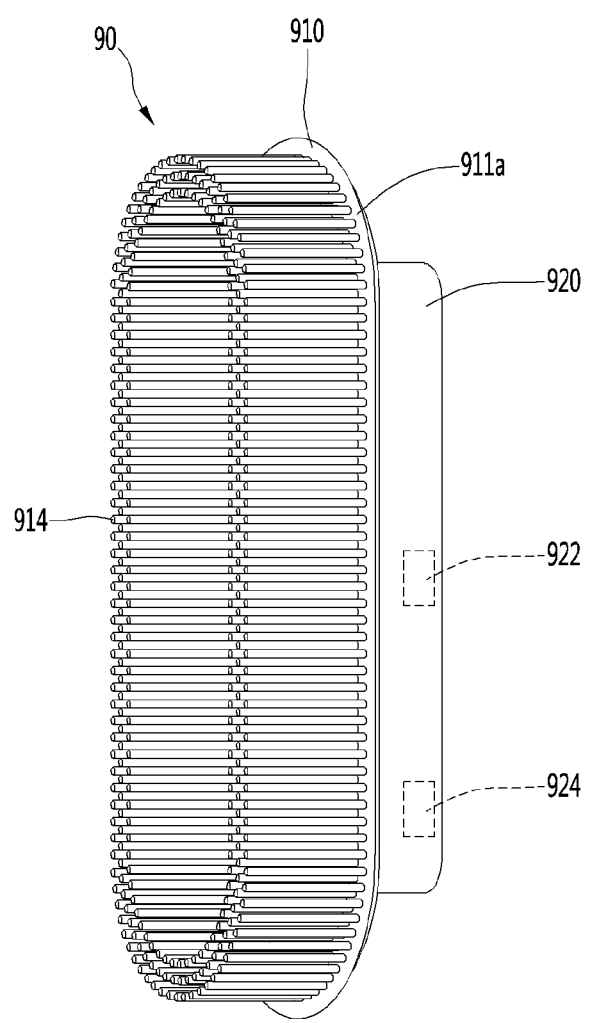
FIGS. 21 and 22 are perspective views of a third care tool.
Figure 22:
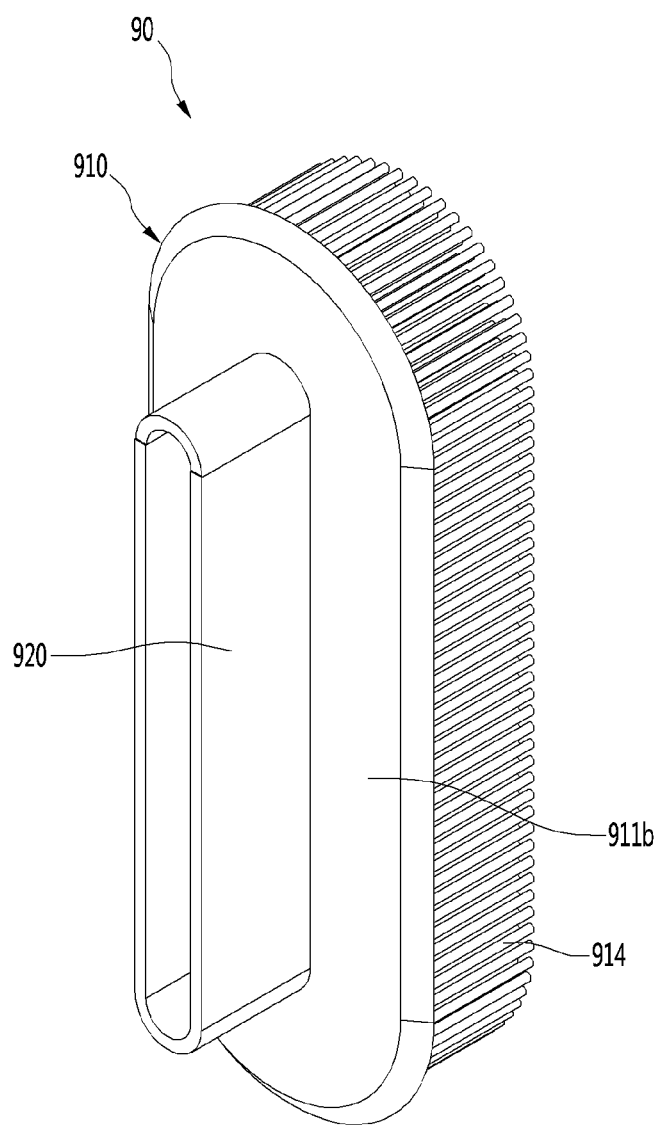
Figure 23:
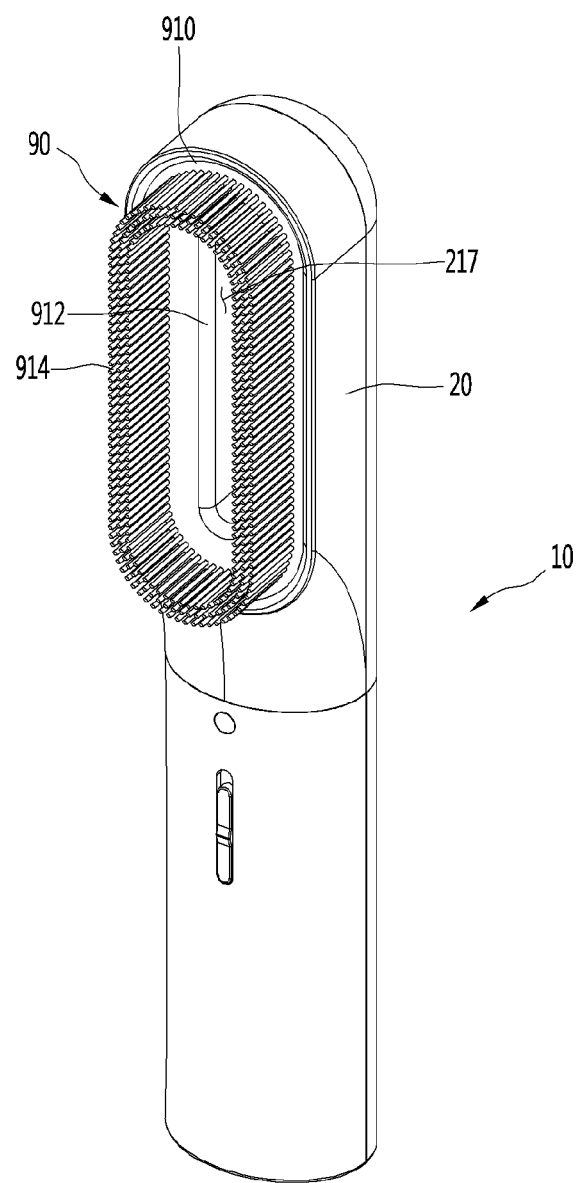
FIG. 23 is a perspective view showing a state in which the third care tool is coupled to the main body.

Referring to FIGS. 21 to 23, a third care tool 90 may be detachably coupled to the head 20 of the main body 10. The third care tool 90 may be, for example, a pet brush to brush or comb pet hair.

The third care tool 90 may include a plate-shaped tool body 910 and a head coupler 920 that extends from the tool body 910 to couple with the head 20. A structure of the tool body 910 and the head coupler 920 of the third care tool 90 may be substantially similar to a structure of the the tool body 710 and the head coupler 720 of the first care tool 70. However, the third care tool 90 may not transmit light from the light emitting devices 223, and so there may not be a light collecting surface or any transparent materials. Since the structure may be the same, detailed description thereof will be omitted.

The tool body 910 may be formed in an elliptic shape corresponding to an elliptic shape of the light diffuser 230 and/or the head 20. The tool body 910 may include a first or front surface 911a and a second or back surface 911b opposite to the front surface 911a. The first surface 811a of the tool body 910 may be provided with a plurality of brushes or bristles 914 protruding outward. The plurality of bristles 914 may be arranged in an ellipse form.

A group of bristles 914 arranged in an ellipse may be referred to as a brush group. A plurality of brush groups, each brush group formed of a plurality of bristles, may be provided on the first surface 911a of the tool body 910 to extend frontward away from the first surface 911a. Since the third care tool 90 may not transmit light from the light emitting devices 223 of the sterilizer 220, an arrangement or alignment of the bristles 914 may not be limited. As an alternative, the third care tool 90 may be configured to transmit light from the light emitting devices 223, and a brush group among the plurality of brush groups may align with the light emitting devices 223.

The tool body 910 may be provided with an opening 912 through which hairs separated from the pet may pass to the second space 217 of the head 20. The head coupler 920 may extend from the back surface 911b of the tool body 910. The head coupler 920 may protrude in a direction opposite to a protruding direction of the plurality of bristles 914.

The head coupler 920 may be inserted into and coupled to the inner body 210 of the head 20. The head coupler 920 may extend from a circumference of the opening 912 of the tool body 910 and may have an elliptic shape. The head coupler 920 may include a tool space 926 that communicates with the opening 912 of the tool body 910. The opening 712 of the tool body 710 may serve as an inlet to the tool space 726.

The head coupler 920 may have a shape configured to correspond to a shape or inner contour of the inner body 210 of the head 20. The head coupler 920 may be configured to be inserted into the first opening 214 of the inner body 210 to be provided within the second space 217. When the head coupler 920 is inserted into the inner body 210 of the head 20, the tool space 926 of the head coupler 920 may communicate with the second space 217. Hair separated from the pet may flow through the opening 912 of the third care tool 90 and may be drawn into the second space 217 of the 20.

A coupling of the head coupler 920 to the inner body 210 may be substantially similar to a coupling between the head coupler 720 of the first care tool 70 and the inner body 210. The head coupler 920 may include a magnet 922 having a third magnetic force different in magnitude from the first and second magnetic forces. The controller may determine that the third care tool 90 is coupled to the head 20 when the care tool sensor 290 senses the third magnetic force from the magnet 922 of the third care tool 90.

When the controller determines that the third care tool 90 is mounted to the head 20, the controller may control the sterilizer 220 such that all of the plurality of light emitting devices 223 are turned off. The sterilizer 220 may not operate when the third care tool 90 is mounted and in use. When the controller determines that the third care tool 90 is mounted to the head 20, the controller may supply power to the ionizer 270 to operate the ionizer 270.

The head coupler 920 may include a second fixing portion 924 for interacting with the first fixing portion 292 of the inner body 210. Like the second fixing portion 724 of the first care tool 70, the second fixing portion 924 of the third care tool 90 may be a magnet or a metal interacting with a magnet or metal of the first fixing portion 292, and the first and second fixing portions 292 and 924 may secure a coupling of the third care tool 90 to the head 20 via magnetic attraction.

Figure 24:
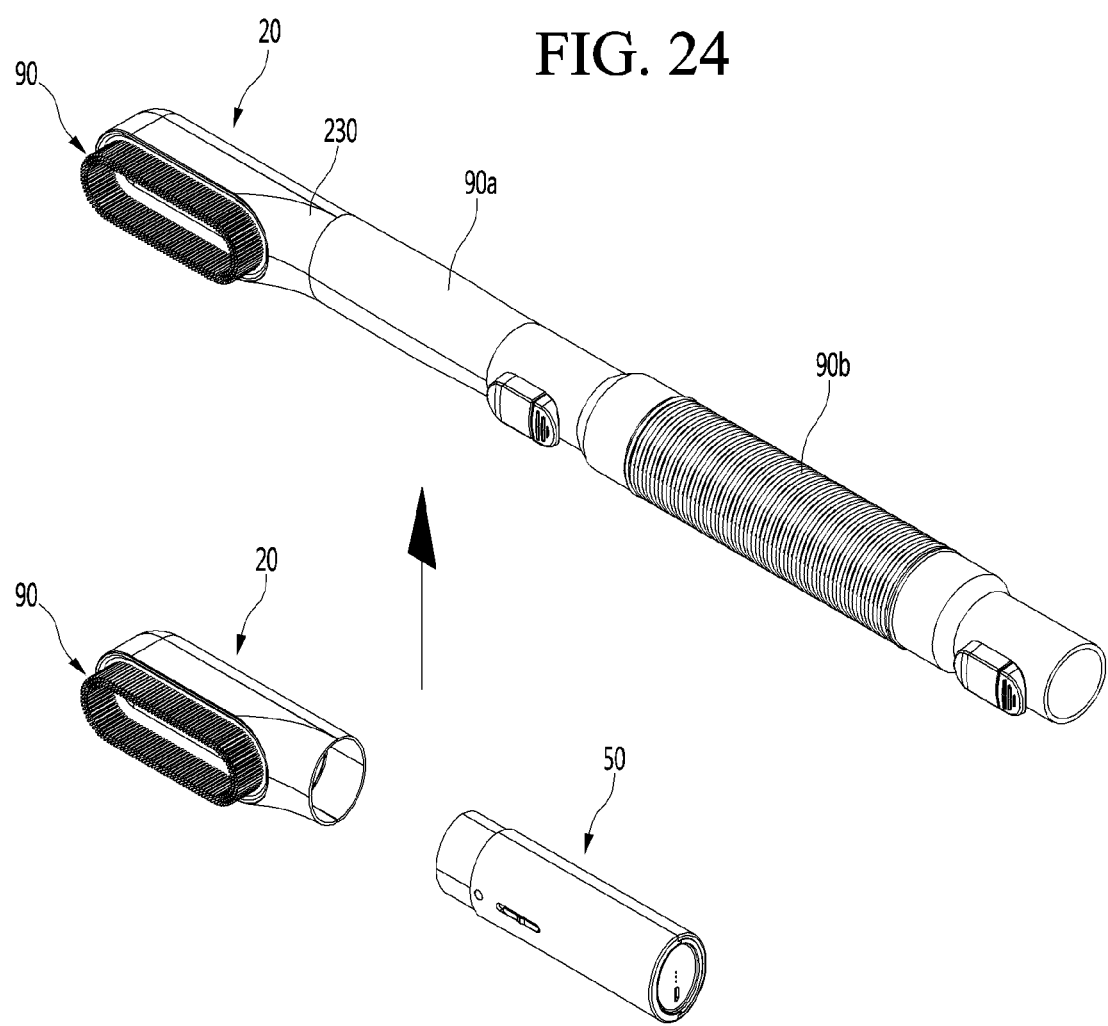
FIG. 24 is a view showing a state in which the third care tool and a cleaning connector or hose are connected to the head.

Referring to FIGS. 22 and 24, a cleaning connector 90*a* and a connection hose 90*b* may additionally be coupled to the head 20 and may replace the handle 50. The cleaning connector 90*a* and connection hose 90*b* may further be attached to a vacuum cleaner, and may be used in conjunction with a care tool attached to the head 20 to facilitate vacuum cleaning and to discard debris collected in the second space 217 of the head 20. Although FIG. 24 shows an example where the cleaning connector 90*a* and connection hose 90*b* are used with the third care tool 90 attached to the head 20, embodiments disclosed herein are not limited thereto and any care tool having an opening in communication with the second space 217 may be used. For example, the first care tool 70 may be used with the cleaning connector 90*a* and connection hose 90*b*.

The handle 50 may be pulled off and separated from the head 20. The cleaning connector 90*a* may be inserted into and connected to the first coupler 230 of the head 20. The cleaning connector 90*a* may, for example, include a recessed portion in an outer circumferential surface that is inserted into the first coupler 230, and/or include a metal or magnet that may attract to a metal or magnet provided in the first coupler 230. A flow path may be formed inside the cleaning connector 90*a*. The cleaning connector 90*a* may be connected to the connection hose 90*b*, which may be connected to the cleaner and have a flow path communication with the flow path of the cleaning connection 90*a*. Alternatively, the cleaning connector 90*a* may be directly connected to the vacuum cleaner, and the connection hose 90*b* may be omitted. The connection hose 90*b* may also have a recessed portion that is inserted into and coupled to a bottom opening of the cleaning connection 90*a*.

The cleaning connector 90*a* may have a cylindrical or elliptical shell shape, and may optionally include an operation switch, which may operate a locking mechanism to further couple to the connection hose 90*b*. During use, the user may grip the cleaning connector 90*a* to sweep the bristles 914 of the third care tool 90 along the hair or fur of the pet. The connection hose 90*b* may include an elastic portion so that the connection hose 90*b* may be flexible and bent without blocking the flow path of the connection hose 90*b*. As an example, the elastic portion of the connection hose 90*b* may have a cylindrical or elliptical accordion structure. The connection hose 90*b* may also include an operation switch, which may operate a locking mechanism to couple to an inlet of the vacuum cleaner.

The user may attach the third care tool 90 to the head 20, connect the cleaning connector 90*a* to the first coupler 230 of the head 20, and connect the cleaning connector 90*a* to the vacuum cleaner via the connection hose 90*b* so that the openings in the tool body 910 and the head coupler 920 and the second space 217 communicate with the flow paths of the cleaning connector 90*a* and cleaning hose 90*b* and ultimately a flow path of the vacuum cleaner. The user may operate the vacuum cleaner after brushing to suction debris collected in the second space 217 into a dust bin of the vacuum cleaner. The user may also operate the vacuum cleaner during brushing to help suction hair from the pet and to keep the bristles 914 free from hair.

Figure 25:
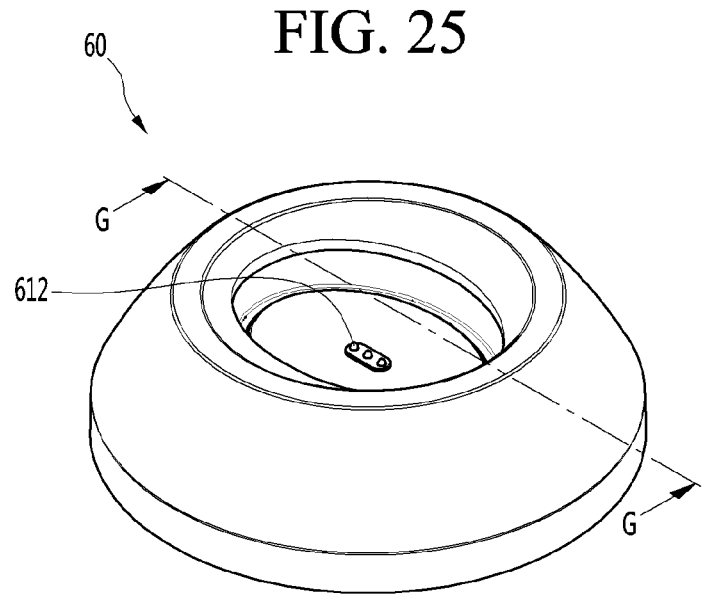
FIG. 25 is a perspective view of a supporter or base according to an embodiment.
Figure 26:
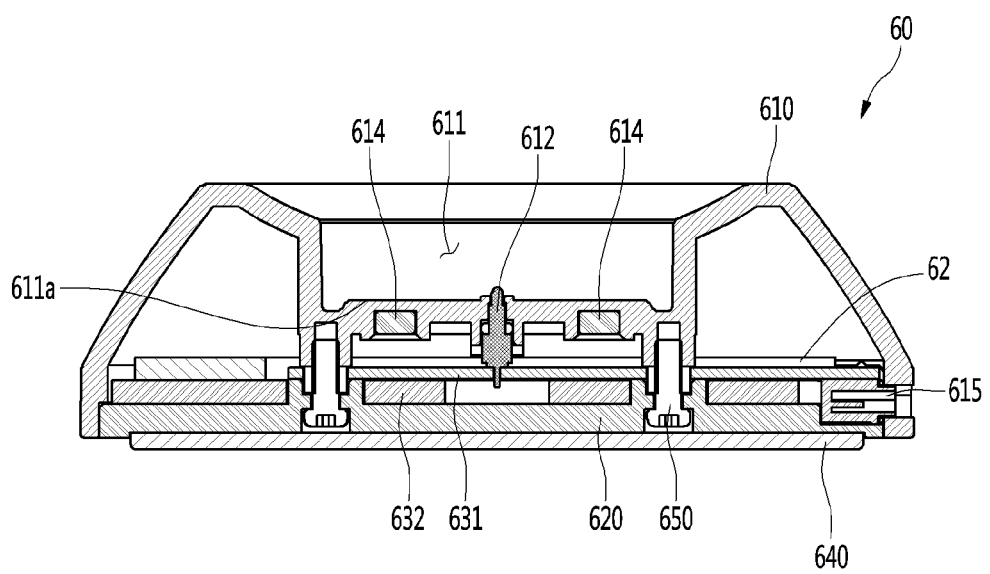
FIG. 26 is a cross-sectional view taken along the line G-G of FIG. 25.
Figure 27:
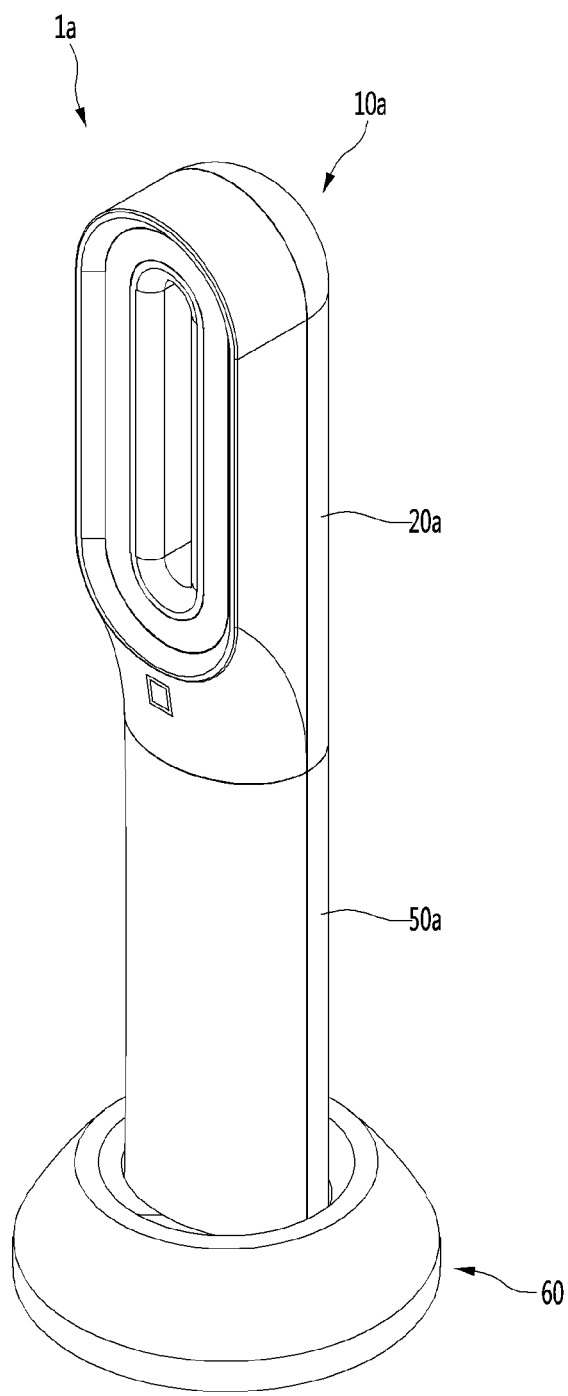
FIG. 27 is a view showing a pet care device according to another embodiment.
Figure 28:
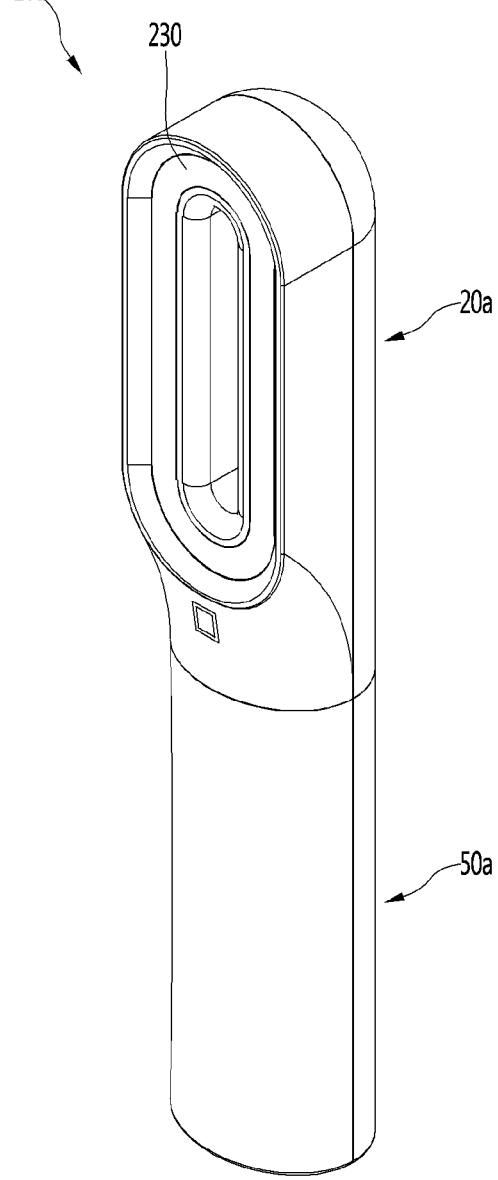
FIG. 28 is a perspective view of a main body according to another embodiment.
Figure 29:
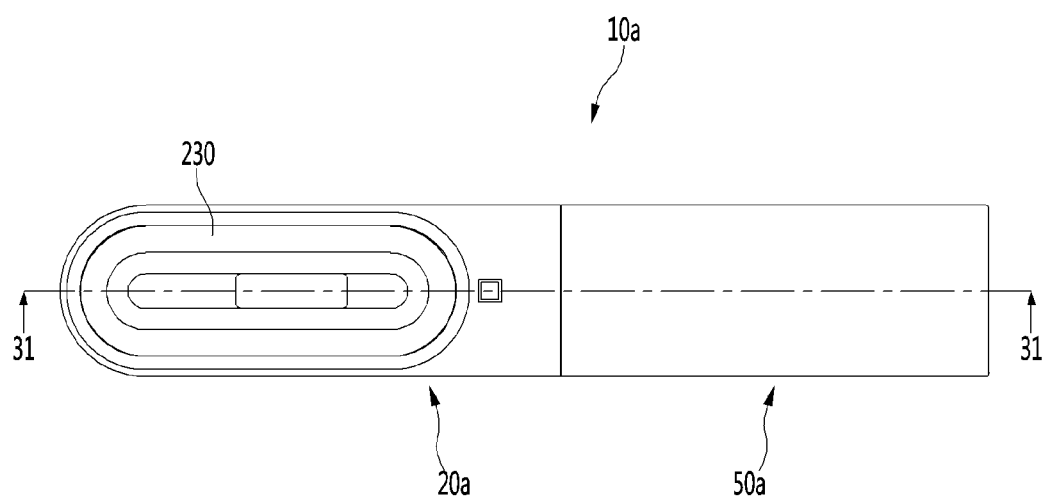
FIG. 29 is a plan view of the main body of FIG. 28.
Figure 30:
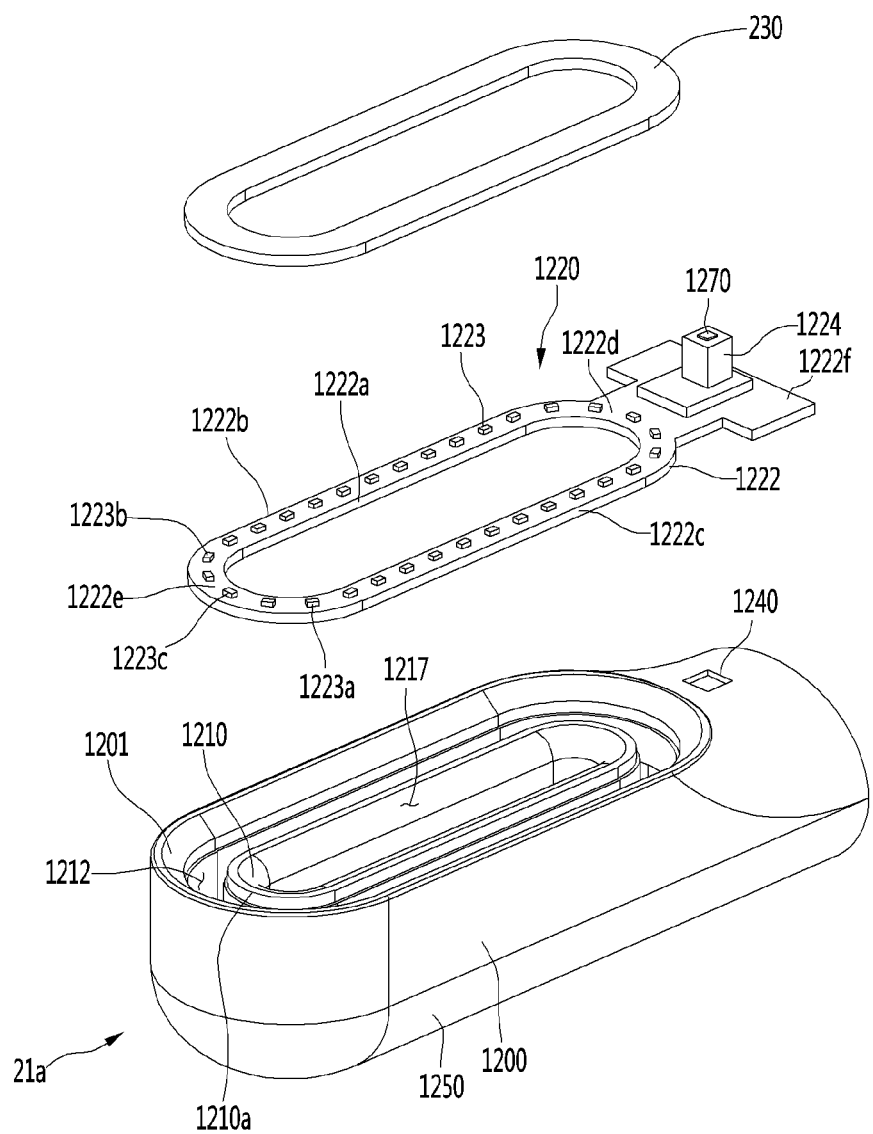
FIG. 30 is a perspective view showing a state in which a light emitting device is separated from a head of the main body.
Figure 31:
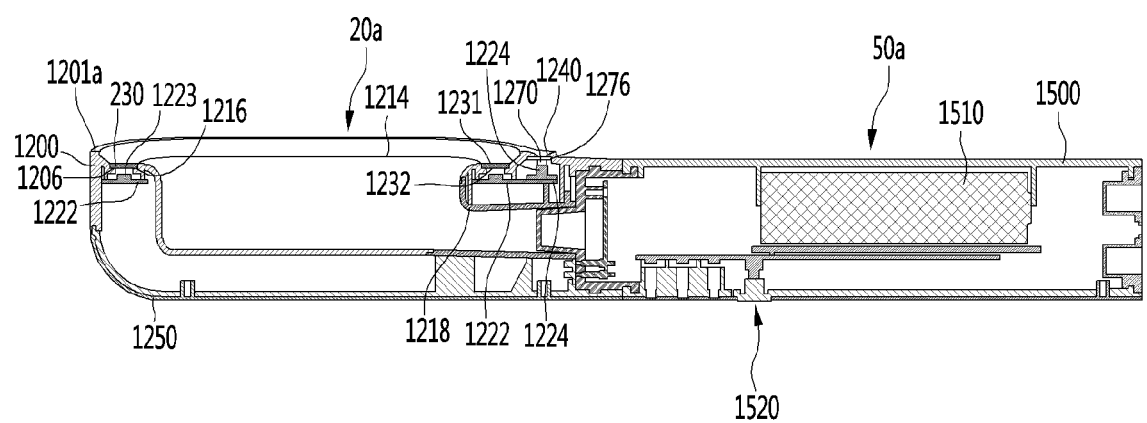
FIG. 31 is a cross-sectional view taken along the line 31-31 of FIG. 29.

Referring to FIGS. 25 and 26, the base 60 may include a receiving portion or space 611 to receive a bottom portion of the handle 50. The receiving space 611 may be formed by recessing a portion of the upper surface of the base 60 downward. A base terminal 612 to contact the first charging connector 565*a* of the handle 50 may be provided in the bottom of the base 60 to at least partially protrude or be exposed at a bottom of the receiving space 611.

The base 60 may include an upper body or case 610 and a lower body or case 620 coupled to a lower portion of the upper body 610. The receiving space 611 may be formed in the upper body 610. At least one magnet 614 may be installed or located in a bottom 611*a* of the upper body 610 below the receiving space 611.

A bottom of the handle 50 may be provided with one or more magnets or metals that interact with the magnet 614. As an example, a magnet or a metal may be provided at the first cover 570 (FIG. 7) of the handle 50. The magnet provided on the handle 50 may have a first pole or polarity, and the magnet 614 provided on the base 60 may have a second pole or polarity opposite to the first pole.

The base 60 may include one or more weights 631 and 632 provided between the upper body 610 and the lower body 620. The one or more weights 631 and 632 may be configured to increase a weight of the base 60 to prevent shaking or tilting of the main body 10 supported by the base 60. The one or more weights 631 and 632 may be formed of a rigid or heavy material such as metal material.

The upper body 610 and the lower body 620 may be coupled to each other via a fastening member 650 (e.g., bolt, screw, or lock). A bottom of the lower body 620 may be provided with a pad or cushion 640 to prevent slipping. The pad 640 may be attached to a bottom surface of the lower body 620, and may be formed of a material such as silicon or rubber.

Referring to FIGS. 27 to 31, another embodiment of a pet care device 1a may include a main body 10a, a handle 50a, and a head 20a. The handle 50a may be supported by a support or base 60. Since a form and function of the pet care device 1a may be the same or similar to that of the pet care device 1 of the previous embodiment, only differing characteristics or features of the pet care device 1a will be described below. The embodiment described with reference to FIGS. 27-31 may differ from the embodiment described with reference to FIGS. 1-16 in that a proximity sensor 1270 may be provided in the head 20a instead of the handle 50a.

The head 20a may include a sterilizer 1220, and the handle 50a may supply power to the sterilizer 1220. The head 20a may include a light diffuser 230 through which light emitted from at least one light emitting device 1223 of the sterilizer 1220 is transmitted. Light may be irradiated through the light diffuser 230 of the head 20a toward a pet to treat the pet's skin.

The light emitting device 1223 may include a UV LED. When the UV LED is irradiated to the skin of the pet, bacteria or viruses of the skin of the pet may be removed, skin diseases may be cured, and skin health may be maintained. The user may treat or manage pet skin or hair by bringing a front portion of the head 20a where the light diffuser 230 is located close to an area of the pet to be managed or treated. The head 20a may be detachably coupled to the handle 50a, or alternatively may be integrally formed with the handle 50a. When the head 20a and the handle 50a are separated, the head 20a may be cleaned with water.

The pet care device 1a may further include the base 60 to support the main body 10a. Since the base 60 may be substantially the same as the base 60 described in the previous embodiment, a detailed description thereof will be omitted.

The head 20a may include a head body 21a, the sterilizer 1220 provided in the head body 21a, and the light diffuser 230 covering the sterilizer 1220. The head body 21a may include a first space 1212 in which the sterilizer 1220 is inserted and a second space 1217 partitioned from the first space 1212.

Like the first and second spaces 212 and 217 of the previous embodiment, the first space 1212 may be an elliptical space or groove provided to surround a front of the second space 1217. Since the sterilizer 1220 may be provided to cover the first space 1212, the sterilizer 1220 may surround the front of the second space 1217.

Pet hair or fur may flow into the second space 1217 when the main body 10a is used. In addition, when a care tool is coupled to the head 20a of the main body 10a, a part of the care tool may be inserted into the second space 1217. Since the second space 1217 may be partitioned from the first space 1212, hair flowing into the second space 1217 may be prevented from entering the first space 1212.

The head body 21a may include, a first head body or frame 1200 and a second head body or frame 1250 coupled to the first frame 1200. The first frame 1200 may include the first space 1212. The first frame 1200 may include an outer body 1201 and an inner body 1210 positioned in an inner region of the outer body 1201.

The inner body 1210 may be formed in an ellipse shape to form a first opening 1214 therein. The first opening 1214 of the inner body 1210 may serve as an inlet of the second space 1217, and at least a part (e.g., back or bottom part) of the second space 1217 may be located in the inner space of the inner body 1210.

At least a portion of the outer body 1201 may be formed in a shape corresponding to the inner body 1210 to surround an outer side of the inner body 1210. The first space 1212 may be formed between the outer body 1201 and the inner body 1210. The outer body 1201 and the inner body 1210 may be connected by a support wall 1218.

The sterilizer 1220 may be seated on a front or an upper surface of the support wall 1218. The outer body 1201 may be formed with a first support groove 1206 to support the light diffuser 230. An outer circumferential surface of the inner body 1210 may define the first space 1212. An inner circumferential surface of the inner body 1210 may form the first opening 1214. The inner body 1210 may be formed with a second support groove 1216 to support the light diffuser 230. The light diffuser 230 may be fused or adhered in the first support groove 1206 and the second support groove 1216 to be coupled to the head body 21a.

A front or outer surface 1231 of the light diffuser 230 may be spaced inwardly or backward from an outer side or end 1201a of the outer body 1201, and the outer end 1201a of the outer body 1201 may protrude outward or frontward from the light diffuser 230. Even if the outer end 1201a of the outer body 1201 is in contact with the skin of the pet, the light diffuser 230 may be prevented from coming into direct contact with the pet skin. In addition, even if the main body 10a is placed or rested on a surface and the outer end 1201a contacts the surface, the light diffuser 230 may not contact the surface, which may prevent or reduce damage to the light diffuser 230.

A back or inner surface 1232 of the light diffuser 230 may face the light emitting device 1223 of the sterilizer 1220. The inner surface 1232 of the light diffuser 230 may be spaced apart from the sterilizer 1220. An outer end or side 1210a of the inner body 1210 may be located within the outer end 1201a of the outer body 1201.

The sterilizer 1220 may include a PCB 1222 and a plurality of light emitting devices 1223 provided on a front surface of the PCB 1222. The plurality of light emitting devices 1223 may be ultraviolet light emitting diodes (UV LEDs) as described above. To improve skin care performance of the pet by the sterilizer 1220, the PCB 1222 may be formed in an elliptical or stadium shape, but embodiments disclosed herein are not limited to an elliptical PCB. The PCB 1222 may be provided to surround the inner body 1210 and may include an opening 1222a through which the inner body 1210 passes.

The light emitting device 1223 may be installed on the front surface of the PCB 1222 and may be provided to face the light diffuser 230. The PCB 1222 may include a pair of curved connection portions 1222d and 1222e connecting a pair of longitudinal portions or extensions 1222b and 1222c. Each of the longitudinal portions 1222b and 1222c may extend in a straight line so that the PCB 1222 has a stadium shape, or alternatively may have a slight curvature so that the PCB 1222 has an elliptical shape. A length of each of the longitudinal portions 1222b and 1222c may be longer than a length of each connection portion 1222d and 1222e.

A plurality of light emitting devices 1223 may be installed in each of the longitudinal portions 1222b and 1222c. Each of the connection portions 1222d and 1222e may also be provided with a plurality of light emitting devices 1223.

The light emitting devices 1223 provided in the connection portions 1222d and 1222e may include a first light emitting device 1223a and a second light emitting device positioned adjacent to each of the longitudinal portions 1222*b* and 1222*c*. At least one third light emitting device 1223*c* may be positioned between the first and second light emitting devices 1223*a* and 1223*b*.

Since the PCB 1222 may be formed in an ellipse or stadium shape, the light emitting devices 1223 may be arranged to form a virtual ellipse, and may optionally be spaced apart from each other at equal intervals. The plurality of light emitting devices 1223 may be provided in a central portion of the PCB 122 to be spaced apart from the inner body 1210.

The head 20*a* may further include a sensor PCB 1222*f* connected to the PCB 1222. The sensor PCB 1222*f* may be integrally formed with the PCB 1222, or alternatively may be manufactured separately and later coupled or electrically connected to the PCB 1222. The sensor PCB 1222*f* may extend from the connection portion 1222*d*, which may be closer to the handle 50 than the connection portion 1222*e*. When the sensor PCB 1222*f* is manufactured separately from PCB 1222, the sensor PCB 1222*f* may be connected and/or coupled to the connection portion 1222*d*.

A proximity sensor 1270 may be installed in the sensor PCB 1222*f*. The proximity sensor 1270 may be used to determine a distance between the head 20*a* and the pet. The proximity sensor 1270 may operate like the proximity sensor 557 of the previous embodiment. The head body 21*a* may include a transmission hole 1240 through which a signal (e.g., light or electromagnetic radiation) radiated from the proximity sensor 1270 may be transmitted. The transmission hole 1240 may be covered by a transmission hole cover or lens 1276. Light irradiated from the proximity sensor 1270 may pass through the transmission hole cover 1276.

The proximity sensor 1270 may be located close to the transmission hole 1240 or the transmission hole cover 1276 and may be positioned a predetermined height or distance away from the sensor PCB 1222*f*. A sensor support 1224 may be provided between the sensor PCB 1222*f* and the proximity sensor 1270, and the sensor support 1224 may be configured so that the proximity sensor 1270 is the predetermined distance away from the sensor PCB 1225. The sensor support 1224 and the proximity sensor 1270 may be positioned at a more forward position or higher than the light emitting device 1223 on the PCB 1221.

When the proximity sensor 1270 is installed in the PCB 1222 of the head 20*a* as in the present embodiment, an additional structure for installing and implementing the proximity sensor 1270 may not be required, simplifying an overall structure. In addition, since the proximity sensor 1270 may be located in the head 20*a* instead of the handle 50*a*, a proximity of the head 20*a* to the pet may be more accurately determined. In addition, a wiring structure to supply power to the light emitting device 1223 and the proximity sensor 1270 may be simplified.

The handle 50*a* may include a handle body 1500. A battery 1510 may be provided inside the handle body 1500. The battery 1510 may be an auxiliary or secondary battery that can be charged by power supplied from the outside.

The handle body 1500 may include an operation device 1520. The operation device 1520 may be a user interface, and may include a switch or a button. By operating the operation device 1520, an ON/OFF command of the sterilizer 1220 may be input. Alternatively or in addition thereto, an intensity of the sterilizer 1220 may be adjusted via the operation device 1520 when the sterilizer 1220 is turned on.

Figure 32:
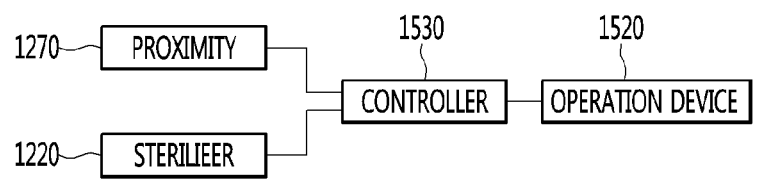
FIG. 32 is a block diagram of a main body according to another embodiment.

Referring to FIGS. 32 and 33, the main body 10*a* may include a controller 1530. The controller 1530 may be provided in the handle 50*a*. When the ON command is input via the operation device 1520, the controller 1530 may control the sterilizer 1220 according to a distance sensed by the proximity sensor 1270. The proximity sensor 1270 may include a light transmitter or light emitting device to irradiate light and a light receiver or a light receiving device to receive light.

When the ON command is input via the operation device 1520, the controller 1530 may turn on the sterilizer 1220 when an ON condition of the sterilizer 1220 is satisfied. The ON condition of the sterilizer 1220 may be a condition based on the sensed distance of the proximity sensor 1270.

The controller 1530 may determine whether an amount of light received from the light receiving device is greater than or equal to a predetermined light amount or intensity, which may indicate that a distance between the head 20*a* and the pet is less than or equal to a predetermined distance D1. The ON condition of the sterilizer 1220 may be satisfied when the light received is greater than or equal to the predetermined light amount or intensity.

When the ON condition of the sterilizer 1220 is satisfied, the controller 1530 may control the sterilizer 1220 to turn on. When the ON command is input through the operation device 1520 but the ON condition is not satisfied, the controller 1530 may not control the sterilizer 1220 to turn on and may maintain an off state of the sterilizer 1220.

Figure 33A:
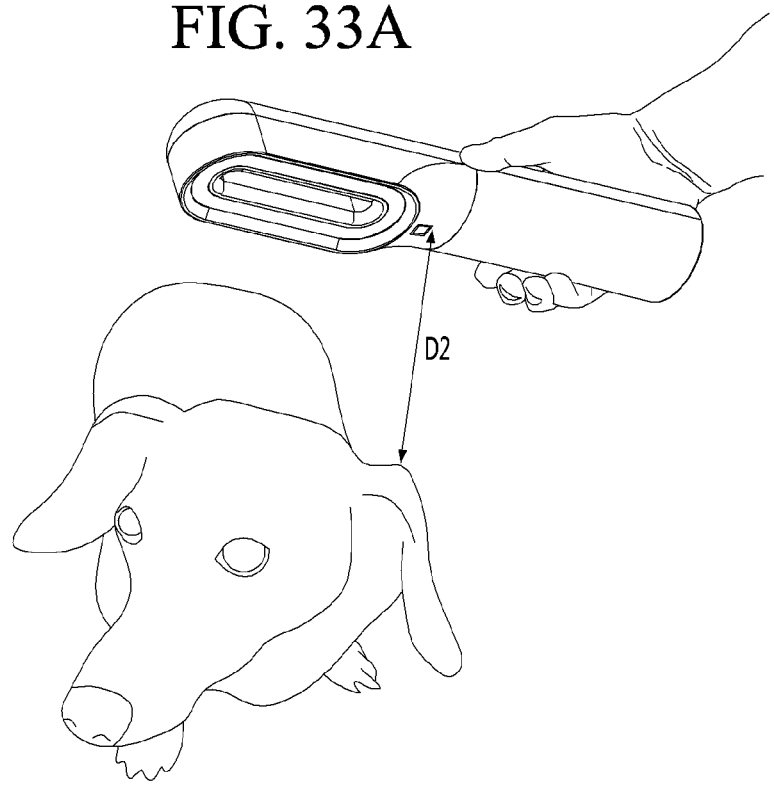
FIGS. 33A and 33B are views illustrating an on or off state of a light emitting device according to a distance between a main body and a pet.

As shown in FIG. 33A, when the distance D2 between the head 20*a* and the pet is greater than the predetermined distance D1, the sterilizer 1220 is not turned on. When the distance D2 between the head 20*a* and the pet is greater than the predetermined distance D1, the head 20*a* may not be close to the pet, oriented to face upwards, or stored in the base 60 such that the main body 20*b* is erected. In such a case, the sterilizer 1220 is maintained in the off state to prevent or reduce UV radiation from the sterilizer 1220 reaching the user or a pet's eye and unnecessary battery power consumption.

Figure 33B:
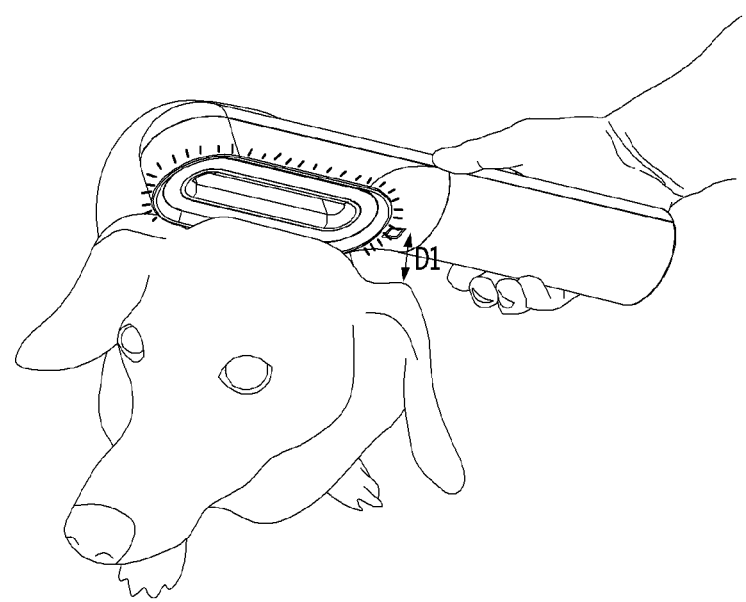

As shown in FIG. 33B, when the distance between the head 20*a* and the pet is within the predetermined distance D1, the controller 1530 may operate the sterilizer 1220 to turn on to treat and care for the pet. Light irradiated from the sterilizer 1220 may be directed to pet hair and skin.

When an OFF command is input via the operation device 1520, the controller 1530 may control the sterilizer 1220 to turn off. The handle 50*a* may be provided with an optional display light to irradiate light so that a user may easily recognize that the on command of the operation device 1520 has been input. Even if the on command was input via the operation device 1520 but the sterilizer 1220 is in an off state because the ON condition was not satisfied, the display light may confirm that the ON command has been input via the operation device 1520. Alternatively or in addition thereto, the controller 1530 may be configured to control the light emitting device 1223 of the sterilizer 1220 to emit light at a first intensity when an ON command is input via the operation device 1520. When a distance sensed by the proximity sensor 1270 is within the predetermined distance D1 (or alternatively within a second predetermined distance less than the first predetermined distance D1), the controller 1530 may control the light emitting device 1223 to emit light at a second intensity greater than the first intensity.

Embodiments disclosed herein may provide a pet care device having a transmissive portion or light diffuser and at least one light emitting unit or device positioned in a head body or head of the pet care device. The head may be in contact with skin of a pet, and light from the light emitting device may be concentrated on the pet. The light emitting device may include a plurality of light emitting devices, and the plurality of light emitting devices may have an elliptical or stadium arrangement so that an area on the pet to which light is irradiated may increase.

In addition, since the transmissive portion and the light emitting unit may be positioned to be inwardly spaced in the head body in contact with the skin of the pet, the transmissive portion may be separated from the skin of the pet when a main body is used alone, and stimulation of the pet skin can be prevented. Since a tool coupler may be provided in the main body, there is an advantage in that pet skin or hair may be managed by combining various types of care tools.

The main body may include a first space in which the light emitting unit is located and a second space into which the hair of the pet is drawn in. Since the first space may be partitioned from the second space, inflow of the hair of the pet to the space in which the light emitting unit is located may be prevented.

In a state in which the main body is placed on a bottom or resting surface, the transmission portion may be spaced apart from the bottom surface to prevent damage to the transmission portion. When an on condition of the light emitting unit is satisfied when the main body is used alone, since the light emitting unit may be operated, the light emitted from the light emitting unit may be restricted from being transmitted to a user side.

Since the head and the handle may be separated and the head may be waterproof, there is an advantage in that cleaning of the head (e.g., water cleaning may be possible and effective. Since light irradiated from the light emitting unit at an end of a protrusion of the care tool may be transmitted, the light may be directly irradiated to the skin of the pet, improving a skin care effect. Since an end portion of the protrusion may contact the skin of the pet, the light can be concentrated to the skin of the pet, improving the skin care effect.

Since the light emitting unit may be turned on when the pet care device is in close proximity to the pet, power consumption due to unnecessary operation of the light emitting unit may be prevented, and the light emitting unit may be prevented from directing light toward the user. Since the proximity sensor may be provided in the head, it may be possible to accurately determine whether the head and the pet are in proximity. Since the proximity sensor may be installed in to light emitting unit printed circuit board or PCB, a structure to install the proximity sensor may be simplified.

Embodiments disclosed herein may provide a pet care device that can manage the skin and hair of a pet. Light irradiated from a light emitting unit or device may be concentrated on pet skin. An irradiation area of light irradiated onto the skin of the pet may be increased. A permeation part or light diffuser may be spaced apart from the skin of the pet when a main body is used alone to prevent the permeation part from stimulating the skin of the pet.

Embodiments disclosed herein may provide a pet care device with a tool coupler in a main body to combine various kinds of care tools to manage skin or hair of a pet. Hair is prevented from flowing into a space where a light emitting unit or device is located in a process of managing skin or hair of a pet using the main body. In a state in which the main body is placed on a bottom surface, a permeable part or light diffuser may be spaced apart from the bottom surface, preventing damage.

A head may be cleaned by separating the head from a handle after managing the skin or hair of the pet. Light emitted from the light emitting unit may be restricted from being transmitted to a user side when the main body is used alone.

Power consumption due to unnecessary operation of the light emitting unit when the pet care device is in close proximity to the pet may be prevented. An installation structure of a sensor that detects the proximity of the pet care device and the pet may be simplified, and a detection accuracy by the sensor may be improved.

Embodiments disclosed herein may provide a pet water dispenser including a head having a light emitting unit or device and a handle extending from the head. The head may be formed on an outer body and an inner body positioned in an inner region of the outer body. The light emitting unit may be provided in a first space between the outer and inner bodies. A transmission portion or light diffuser may cover the first space. A second space partitioned from the first space may be at least partially located inside the inner body.

A support plate or wall may connect the inner body and the outer body and supporting the light emitting unit. The light emitting unit may be provided to face the transmission part. Each of the inner body and the outer body may include a support groove to support the transmission portion.

The light emitting unit may include a light emitting unit printed circuit board (PCB) and a plurality of light emitting units provided in the light emitting unit PCB, and the light emitting unit PCB may be formed in an elliptic form or shape. The light emitting unit PCB may be provided to surround the inner body and may include an opening through which the inner body passes.

The transmission part may be formed in an elliptic form. The plurality of light emitting units may be arranged in an ellipse form on the light emitting unit PCB.

The plurality of light emitting units may be (ultraviolet) UV (light emitting diodes) LEDs for irradiating UVC wavelengths in the range of 200-280 nm. At least one UV LED may emit red light.

The head may further include a proximity sensor and a sensor PCB in which the proximity sensor is installed. The sensor PCB may be integrally formed with the light emitting unit PCB or may be connected to the light emitting unit. The head may further include a transmission hole or opening through which light or a signal irradiated from the proximity sensor is transmitted, and a transmission hole cover or transmission medium covering the transmission hole.

A height or distance from the light emitting unit to an outer end of the outer body may be higher than a height or distance from the light emitting unit to an outer end of the inner body. The transmission portion may be provided at a position spaced apart from the outer end of the outer body.

The outer body may include an outer circumferential surface, an inner circumferential surface, and a connection surface connecting the outer circumferential surface and the inner circumferential surface. The inner circumferential surface may define the first space.

The connection surface may include a horizontal plane extending in a horizontal direction from the outer circumferential surface of the outer body toward the inner circumferential surface, and an inclined surface extending toward the inner circumferential surface at an inner end of the horizontal plane. The second space may be bent in a shape such as "L", and hairs separated from the pet may be gathered in the second space.

The handle or the head may be provided with a sensor. The handle may be provided with an operation unit or switch to input an ON command of the light emitting unit. The handle may have a controller capable of controlling the light emitting unit. The controller may turn on the light emitting unit when the ON condition of the light emitting unit is satisfied based on information detected by the sensor.

The sensor may include a gyro sensor and a proximity sensor. The ON condition of the light emitting unit may be detected by the gyro sensor in a state in which the operation unit faces downward from the handle and the head is determined, based on a detection of the proximity sensor, to be close to a predetermined distance to the skin of the pet. The controller may turn on the light emitting unit when a sensing distance detected by the proximity sensor is within a reference distance when an ON command of the light emitting unit is input.

The handle may be provided with a sensor, an operation unit or to input an on command of the light emitting unit, and a controller capable of controlling the light emitting unit. The light emitting unit may be controlled to emit light at a first intensity.

When a normal operating condition of the light emitting unit is satisfied, the controller may control the light emitting unit so that the light emitting unit emits light at a second intensity greater than the first intensity. The sensor may include a gyro sensor and the proximity sensor, and the normal operating condition of the light emitting unit may be detected when the gyro sensor on the handle of the operation unit faces downward, and the proximity sensor detects a state where the head is determined to be close to the skin of the pet by a predetermined distance.

Embodiments disclosed herein may provide a pet care device including a head having a light emitting unit and a handle extending from the head. The head may include a first head body or case in which the light emitting unit is provided and a second head body or case coupled to the first head body. The first head body may form a first space accommodating the light emitting unit, and the first head body and the second head body may form a second space partitioned from the first space.

Embodiments disclosed herein may provide a pet care device including a head having a light emitting unit or sterilizer and a handle extending from the head. The head may include an outer body, an inner body positioned in an inner region of the outer body, and a support wall connecting the outer body and the inner body and on which the light emitting unit may be seated. The sterilizer may include a light emitting unit printed circuit board (PCB) and a plurality of light emitting units or devices provided in the light emitting unit PCB. The light emitting unit PCB may be formed in an ellipse shape and surround the inner body.

The sterilizer may further include a transmission unit or light diffuser covering the sterilizer at a position spaced apart from the sterilizer. The light diffuser may be formed in an elliptic shape.

Embodiments disclosed herein may provide a pet care dispenser having a main body. The main body may include a head having a light emitting unit or sterilizer and a handle extending from the head. The main body may further include a tool body positioned in the head and a plurality of protrusions (e.g., bristles or teeth) protruding from the tool body.

Each of the plurality of protrusions may include a transmission end through which light irradiated from the light emitting unit is transmitted. An outside of each of the protrusions may be provided with a light blocking coating layer. The transmission end may be formed by removing a portion of the coating layer.

The tool body may include a first surface and a second surface opposite to the first surface. The plurality of protrusions may protrude from the first surface. The second surface may be provided with a light collecting surface having a recessed shape. The second surface may be provided with a same number of light collecting surfaces as a number of protrusions and at positions corresponding to positions of the protrusions. The tool body may include a plurality of holes, and the plurality of protrusions may protrude from the tool body through the plurality of holes.

Each of the plurality of protrusions may be provided with a light collecting surface of a recessed form. The head may include a transmission part or light diffuser through which light emitted from the light emitting unit is transmitted, and the light collecting surface may be provided to face the transmission part. The light emitting unit may include a plurality of light emitting units, and some or all of the plurality of light emitting units may be provided to face the light collecting surface.

The care tool may be detachably coupled to the head. The care tool may further include a head engaging portion or head coupler protruding in a direction opposite to an insertion portion in the tool body. The head may include a tool coupler to which the head coupler is inserted and coupled.

The tool coupler may include a first fixing portion having a metal or a magnet. The head coupler may include a second fixing portion having a magnet or a metal to interact with the first fixing portion.

The head may include a first space in which the light emitting unit is located and a second space partitioned from the first space. The tool body may include an opening in communication with the second space.

The first space may be provided to surround the second space, and the first space may be covered by the transmission part. The transmission part may be covered by the tool body.

The care tool may include a head coupler extending in a direction opposite to a protruding direction of the plurality of protrusions in the tool body. The head coupler may be inserted into the second space.

Embodiments disclosed herein may provide a pet care device including a head having a light emitting unit or sterilizer, a handle extending from the head, an operation or input unit or switch provided on the handle to input an on or off command of the light emitting unit, a proximity sensor provided at the head, and a controller configured to control the light emitting unit based on a sensing distance detected by the proximity sensor when the on command of the light emitting unit is input from the operation unit. The light emitting unit may include a plurality of light emitting units or devices and a light emitting unit PCB provided with the plurality of light emitting devices. The head may include a sensor PCB provided with the proximity sensor.

The sensor PCB may be formed integrally with the light emitting unit PCB. Alternatively, the sensor PCB may be connected or electrically coupled to the light emitting unit PCB.

The light emitting unit PCB may include a pair of longitudinal extensions and a pair of curved portions connecting the pair of longitudinal extensions. The sensor PCB may extend from one curved portion of the pair of curved portions. At least two light emitting devices may be provided in each of the longitudinal extensions and the curved portions.

The head may further include a sensor supporter or support to support the proximity sensor so that the proximity sensor may be positioned in a state spaced apart from the sensor PCB by a predetermined height or distance. The head may further include a transmission part or light diffuser through which light emitted from the light emitting unit passes, a transmission hole through which light emitted from the proximity sensor passes, and a transmission hole cover or transmission medium covering the transmission hole.

When the on command of the light emitting unit is input, the controller may turn on the light emitting unit when a sensing distance detected by the proximity sensor is within a reference distance. In a state in which the light emitting unit is turned on, when the sensing distance detected by the proximity sensor is greater than a reference distance, the controller may turn off the light emitting unit.

When the on command of the operation unit is input, the controller may control the light emitting unit to emit light at a first intensity. When the sensing distance detected by the proximity sensor is within a reference distance, the light emitting unit may be configured to operate on the first light. The light emitting unit can be controlled to irradiate light with a second intensity greater than the intensity.

As used herein, the term "ellipse" may be a concept that includes not only a geometric ellipse itself, but a form similar to an ellipse such as a geometric stadium (i.e., a rectangular having two semi-circles at opposite sides), a super ellipse, a lame curve, etc. An ellipse-like form may include a form including two straight lines and two curves connecting both sides of the two straight lines. Thus, "ellipse" as referred to in the specification means a concept that includes "ellipse itself and similar shapes to ellipses".

In addition, terms such as first, second, A, B, (a), and (b) may be used. These terms are only to distinguish the components from other components, and the nature, order, sequence, etc. of the components are not limited by the terms. If a component is described as being "connected", "coupled" or "connected" to another component, that component may be directly connected or connected via another component.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A hair and skin care device, comprising:
a head having at least one light emitting device; and
a handle extending from the head,
wherein the head further includes:
an opening;
an inner body and an outer body surrounding the inner body, a first portion of the opening being provided between the inner body and the outer body, and a second portion of the opening being provided in the inner body;

a first space formed between the outer body and the inner body and in which the light emitting device is provided;

a light diffuser covering the first space to receive light from the light emitting device and guide the light to the first portion of the opening; and a second space formed to be at least partially inside the inner body and having an inlet provided at the second portion of the opening.

2. The hair and skin care device of claim 1, wherein the head further includes a support wall connecting the inner body and the outer body, and the light emitting device is supported by the support wall and positioned to face the light diffuser.

3. The hair and skin care device of claim 1, wherein each of the inner body and the outer body includes a support groove to support the light diffuser.

4. The hair and skin care device of claim 1, wherein the head further includes a first printed circuit board (PCB), the at least one light emitting device includes a plurality of light emitting devices, and the light emitting devices are provided on the first PCB.

5. The hair and skin care device of claim 4, wherein the first PCB includes a PCB opening through which the inner body passes, and the first PCB is provided to surround the inner body.

6. The hair and skin care device of claim 4, wherein the head has an oval or elliptical cross-section.

7. The hair and skin care device of claim 4, wherein the first PCB has an ellipse shape, and the plurality of light emitting devices are light emitting diodes arranged in an ellipse on the first PCB.

8. The hair and skin device care of claim 4, wherein the plurality of light emitting devices are ultraviolet light emitting diodes (UV LEDs) that emit light having a UV-C wavelength within the range of 200-280 nm.

9. The hair and skin care device of claim 4, wherein the head further includes a proximity sensor and a second PCB on which the proximity sensor is provided.

10. The hair and skin care device of claim 9, wherein the second PCB is integrally formed with the first PCB.

11. The hair and skin care device of claim 9, wherein the first PCB includes a pair of longitudinal extensions and a pair of connection portions connecting the pair of longitudinal extensions, and the second PCB extends from one connection portion of the pair of connection portions.

12. The hair and skin care device of claim 9, wherein the head includes a sensor support to support the proximity sensor at a predetermined distance from the second PCB.

13. The hair and skin care device of claim 9, wherein the head includes a transmission hole through which a signal emitted from the proximity sensor is transmitted and a cover to cover the transmission hole.

14. The hair and skin care device of claim 1, wherein a distance from the light emitting device to an outer end of the outer body is greater than a distance from the light emitting unit to an outer end of the inner body.

15. The hair and skin care device of claim 14, wherein the light diffuser is provided at an inner side of the outer end of the outer body.

16. The hair and skin care device of claim 1, wherein the outer body includes an outer circumferential surface, an inner circumferential surface, and a connection surface connecting the outer circumferential surface and the inner circumferential surface, and the inner circumferential surface defines the first space.

17. The hair and skin care device of claim 16, wherein the connection surface of the outer body includes a horizontal surface and an inclined surface, the horizontal surface extending in a horizontal direction from the outer circumferential surface inward, and the inclined surface extending from an inner end of the horizontal surface toward the inner circumferential surface.

18. The hair and skin care device of claim 1, wherein the second space is formed to have an "L" shape and configured to collect debris separated from a surface to be treated.

19. The hair and skin care device of claim 1, wherein at least one of the handle and the head has at least one sensor and a controller, the handle has an input device to input an ON command of the light emitting device, and the controller turns on the light emitting device when an ON condition of the light emitting device is satisfied and when an ON command is input via the input device, the ON condition being based on information detected by the sensor.

20. The hair and skin care device of claim 19, wherein the at least one sensor includes a gyro sensor and a proximity sensor, and the ON condition is satisfied when the gyro sensor detects that the input device faces downward, and the head sensor detects that the head is a predetermined distance or less away from a surface to be treated.

21. The hair and skin care device of claim 19, wherein the sensor includes a proximity sensor, and the ON condition is satisfied when a sensing distance detected by the proximity sensor is a predetermined distance or less.

22. The hair and skin care device of claim 1, wherein the handle has at least one sensor, an input device to input an ON command of the light emitting device, and a controller to control the light emitting device, when the ON command is input via the input device, the controller controls the light emitting device to emit light at a first intensity, and when a normal operation condition is satisfied after the ON command is input, the controller controls the light emitting device to emit light at a second intensity greater than the first intensity, the normal operating condition being based on information sensed by the sensor.

23. The hair and skin care device of claim 22, wherein the at least one sensor includes a gyro sensor and a proximity sensor, and the normal operation condition is satisfied when the gyro sensor detects that the input device faces downward from the handle, and the head sensor determines that the head is a predetermined distance or less away from a surface to be treated.

24. The hair and skin care device of claim 1, wherein the inner body includes a first circumferential surface to define the first space and a second circumferential surface to define the second space such that the inner body partitions the first space and the second space.

* * * * *